United States Patent
Steensgaard-Madsen

(10) Patent No.: US 6,271,782 B1
(45) Date of Patent: Aug. 7, 2001

(54) DELTA-SIGMA A/D CONVERTER

(76) Inventor: Jesper Steensgaard-Madsen, 448 Riverside Dr., Apt. #2, New York, NY (US) 10027

( * ) Notice: Subject to any disclaimer, the term of this patent is extended or adjusted under 35 U.S.C. 154(b) by 0 days.

(21) Appl. No.: 09/541,221

(22) Filed: Apr. 3, 2000

Related U.S. Application Data

(63) Continuation of application No. PCT/IB99/01403, filed on Aug. 6, 1999.
(60) Provisional application No. 60/126,864, filed on Mar. 30, 1999, provisional application No. 60/116,456, filed on Jan. 19, 1999, and provisional application No. 60/095,613, filed on Aug. 6, 1998.

(51) Int. Cl.[7] .................................................. H03M 3/00
(52) U.S. Cl. ........................................... 341/143; 341/156
(58) Field of Search ..................................... 341/143, 156

(56) References Cited

U.S. PATENT DOCUMENTS

| | | |
|---|---|---|
| 4,876,542 | 10/1989 | Bavel et al. . |
| 5,404,142 | 4/1995 | Adams et al. . |
| 5,936,562 * | 8/1999 | Brooks et al. ........................ 341/143 |

FOREIGN PATENT DOCUMENTS

| | | |
|---|---|---|
| 62159518 | 12/1985 | (EP) . |
| 0 454 406 A1 | 10/1991 | (EP) . |

OTHER PUBLICATIONS

A. Wiesbauer et al., "Adaptive Digital Compensation for Analog Circuit Imperfection in Cas. DS Mod." 30th Asilomar Conf. on Sign. Syst. and Computers; Pacific Grove, Calif.; Nov. 3–6, 1996.

Todd Brooks et al, "A Cascaded Sigma Delta Pipeline A/D Converter with 1.25MHz Bandwidth and 89dB SNR" IEEE Journal of Solid State Circuits, vol. 32, No. 12, Dec. 1997.

* cited by examiner

*Primary Examiner*—Howard L. Williams

(57) ABSTRACT

A delta-sigma modulator comprising a first quantizer providing a first digital signal $d_0(k)$ representing the input signal $g(t)$; a loop filter with input signal paths; a loop quantizer providing a corrective digital signal $d_1(k)$ representing the loop filter's output signal $y(t)$; an array of feedback DACs D/A converting the sum $d(k)=d_f(k)=d_0(k)+d_1(k)$ of the first and the corrective digital signals and injecting feedback signals into the loop filter.

The loop filter's input node is applied the difference of the input signal $g(t)$ and the global analog feedback signal $a_3(t)$. The global feedback signal $a_3(t)$ is delayed several clock cycles with respect to the digital output signal $d(k)$. The delay is used to carry out mismatch-shaping and deglitching algorithms in the feedback DACs. The feedback DACs' different delays and gain coefficients are designed such that the modulator is stable. The filter's input signal paths and the compensating DAC are designed such that the gain from the input signal $g(t)$ to the loop quantizer is small, ideally zero. Thus, the loop quantizer's resolving range can be a fraction of the first quantizer's resolving range, whereby the output signal's $d(k)$ resolution can be much higher than the individual resolutions of $d_0(k)$ and $d_1(k)$.

The delta-sigma modulator is well suited for the implementation of high-resolution wide-bandwidth A/D converters. Important applications include digital communication systems.

53 Claims, 15 Drawing Sheets

$$\begin{aligned}
B(z) = \ & z^{-1} \cdot ( \quad b_0 \quad ) \\
+ \ & z^{-2} \cdot ( \quad -3 \cdot b_0 + \quad b_1 \quad ) \\
+ \ & z^{-3} \cdot ( \quad 3 \cdot b_0 - 2 \cdot b_1 + \quad (\tfrac{1}{2} + l_2) \cdot b_2 \quad ) \\
+ \ & z^{-4} \cdot ( \quad -b_0 + \quad b_1 - \quad 2 \cdot l_2 \cdot b_2 + \quad (\tfrac{1}{6} + \tfrac{1}{2} \cdot l_2 + l_3) \cdot b_3 ) \\
+ \ & z^{-5} \cdot ( \quad\quad (-\tfrac{1}{2} + l_2) \cdot b_2 + \quad (\tfrac{4}{6} - 2 \cdot l_3) \cdot b_3 ) \\
+ \ & z^{-6} \cdot ( \quad\quad (\tfrac{1}{6} - \tfrac{1}{2} \cdot l_2 + l_3) \cdot b_3 )
\end{aligned}$$

FIGURE 19

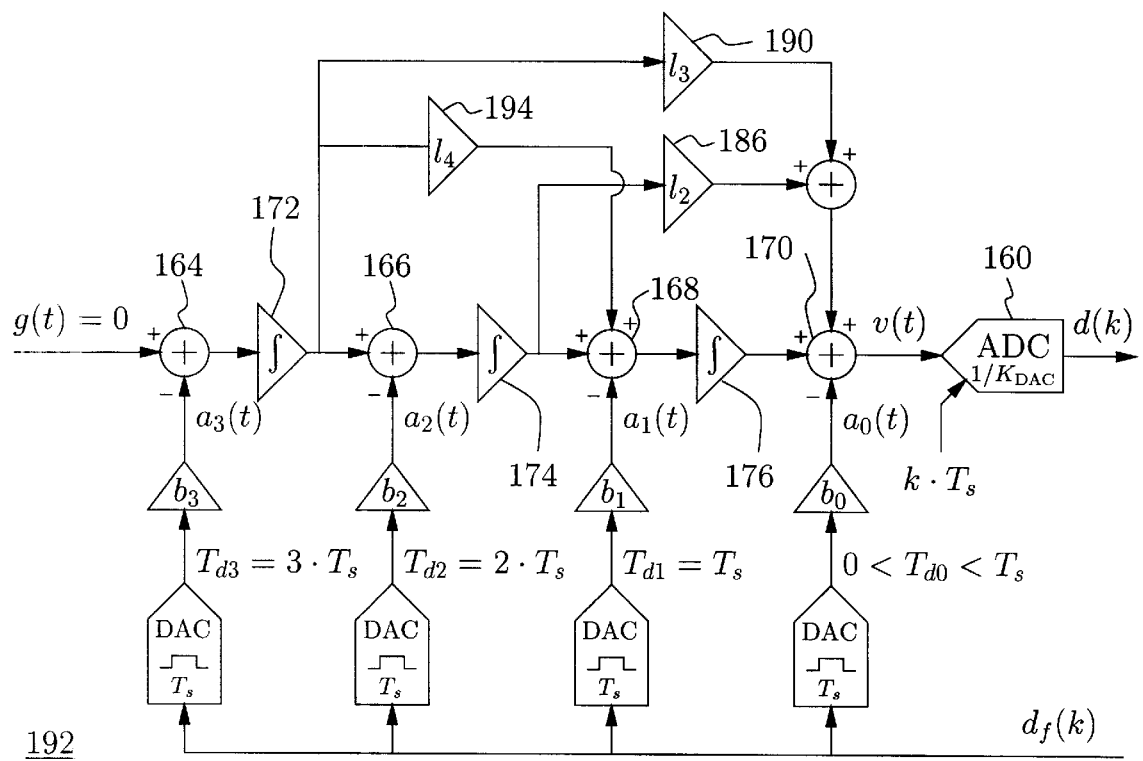

FIGURE 20

$$B(z) = z^{-1} \cdot ( \quad b_0 \quad )$$
$$+ z^{-2} \cdot ( \quad -3 \cdot b_0 \quad + \quad b_1 \quad )$$
$$+ z^{-3} \cdot ( \quad 3 \cdot b_0 \quad - \quad 2 \cdot b_1 \quad + \quad (\tfrac{1}{2}+l_2) \cdot b_2 \quad )$$
$$+ z^{-4} \cdot ( \quad -b_0 \quad + \quad b_1 \quad - \quad 2 \cdot l_2 \cdot b_2 \quad + \quad (\tfrac{1}{6}+\tfrac{1}{2} \cdot l_2 + l_3 + \tfrac{1}{2} \cdot l_4) \cdot b_3 \quad )$$
$$+ z^{-5} \cdot ( \quad (-\tfrac{1}{2}+l_2) \cdot b_2 \quad + \quad (\tfrac{4}{6} - 2 \cdot l_3) \cdot b_3 \quad )$$
$$+ z^{-6} \cdot ( \quad (\tfrac{1}{6} - \tfrac{1}{2} \cdot l_2 + l_3 - \tfrac{1}{2} \cdot l_4) \cdot b_3 \quad )$$

FIGURE 21

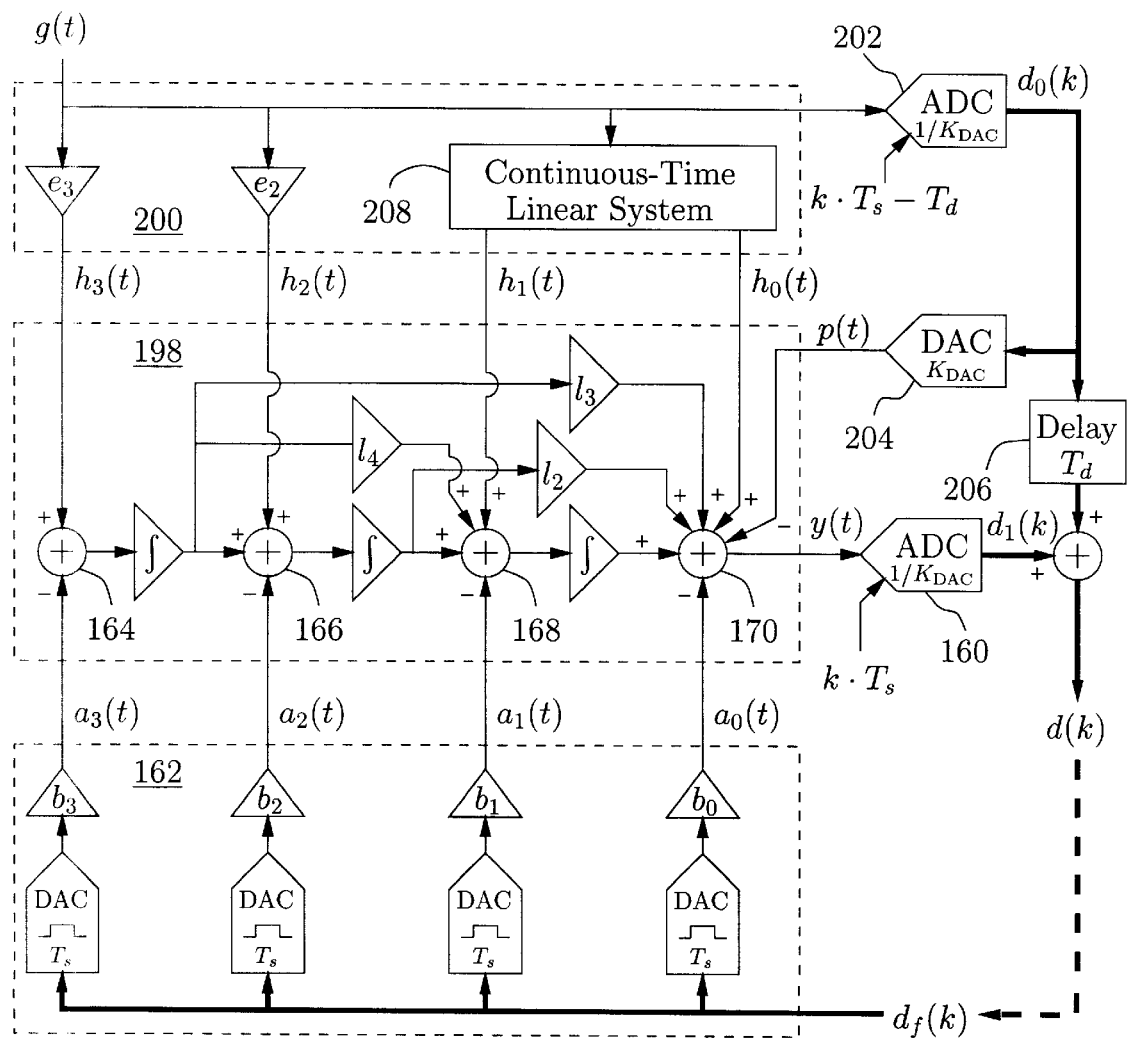

FIGURE 22

DELTA-SIGMA A/D CONVERTER

RELATED APPLICATION DATA

This invention is based on and claims priority from U.S. Provisional Patent Application No. 60/095,613 filed Aug. 6, 1998; U.S. Provisional Patent Application No. 60/116,456 filed Jan. 19, 1999; U.S. Provisional Patent Application No. 60/126,864 filed Mar. 30, 1999; and PCT application PCT/IB99/01403 filed Aug. 6, 1999.

1 FIELD OF INVENTION

The field of invention is data conversion, more particularly, this invention relates to oversampling analog-to-digital converters.

2 DESCRIPTION OF PRIOR ART

Figure 1:
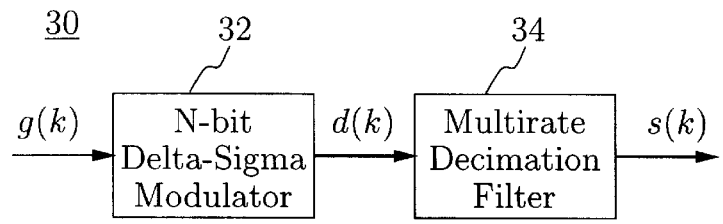

Delta-sigma modulation has been used successfully for the implementation of high-resolution A/D converters. The general concept is shown in FIG. 1. The analog input signal g(k) is converted to a digital representation d(k) using an N-bit delta-sigma modulator [32]. The resolution N of d(k) is lower than the A/D converter system's [30] effective resolution, but the sampling frequency of d(k) is comparably higher than twice the system's [30] bandwidth, i.e., d(k) is an oversampled signal. A signal's sampling frequency divided by twice the system's [30] bandwidth is called the signal's oversampling ratio OSR, which is always greater than one. Thus, d(k) is not an accurate representation of g(k) on a sample-to-sample basis, but a good delta-sigma modulator [32] will ensure that the spectral composition of g(k) and d(k) are essentially linearly related in the system's [30] signal band. A multi-rate decimation filter [34] is generally used to suppress the spectral components of d(k) outside the signal band, and to lower the sampling frequency such that the overall output signal s(k) is only slightly oversampled.

Single-bit delta-sigma modulators [32], i.e., modulators for which N=1, have generally been preferred because they can be designed to be inherently linear. However, single-bit modulation requires the oversampling ratio of d(k) to be very high, say 128, if the overall effective resolution is to be in the order of 16 bits. Thus, single-bit delta-sigma modulation has been used mainly for the implementation of audio A/D converters, which are characterized by high demands for linearity in a relatively low bandwidth; approximately 100 dB performance in a 20 kHz bandwidth.

Several new applications, including digital communication systems such as xDSL modems, require high-resolution A/D conversion in a bandwidth of several mega Hertz. Delta-sigma modulation is a very interesting technique also for such applications, simply because the linearity requirements are more strict than what can be fulfilled using other techniques in low-cost integrated-circuits technologies. The relatively high bandwidth implies that d(k) should be oversampled as little as possible because the sampling frequency of the analog delta-sigma modulator [32] cannot be increased arbitrarily.

The simplest way to lower the oversampling ratio without degrading the performance is to increase the resolution N of d(k). The bottleneck in the design of multi-bit delta-sigma modulators [32] used to be the design of an internally-used feedback D/A converter, which must be very linear. However, with the development of mismatch-shaping D/A converters (see, e.g., U.S. Pat. Nos. 5,138,317; 5,221,926; 5,404,142; and 5,684,482) it has become feasible to implement inherently linear multi-bit delta-sigma modulators [32]. The complexity of these mismatch-shaping circuits unfortunately becomes impractically high when the resolution N is significantly higher than (say) 6 bits. Although good wide-bandwidth delta-sigma A/D converters [30] can be implemented to operate with an internal resolution of only 6 bits, it is clearly preferable to increase the internal resolution if this can be obtained without significantly increasing the modulator's [32] complexity. One important incentive to increase the internal resolution is that the decimation filter [34] thereby can be simplified. The decimation filter's [34] complexity and power consumption is often comparable to, or even higher than, that of the delta-sigma modulator [32]. Thus, simplifications of the decimation filter [34] are to be considered important improvements of the system [30].

High-Resolution Delta-Sigma Modulators.

U.S. patent application with Ser. No. 60/044,665, filed by the applicant for this patent, describes the most efficient mismatch-shaping D/A converters developed so far. It facilitates 100 dB performance at only 10 times oversampling, and the circuit's complexity is relatively low and essentially independent of the resolution N. Hence, these mismatch-shaping D/A converters are very useful for the implementation of delta-sigma modulators [32] operating with a high physical resolution N.

Figure 2:
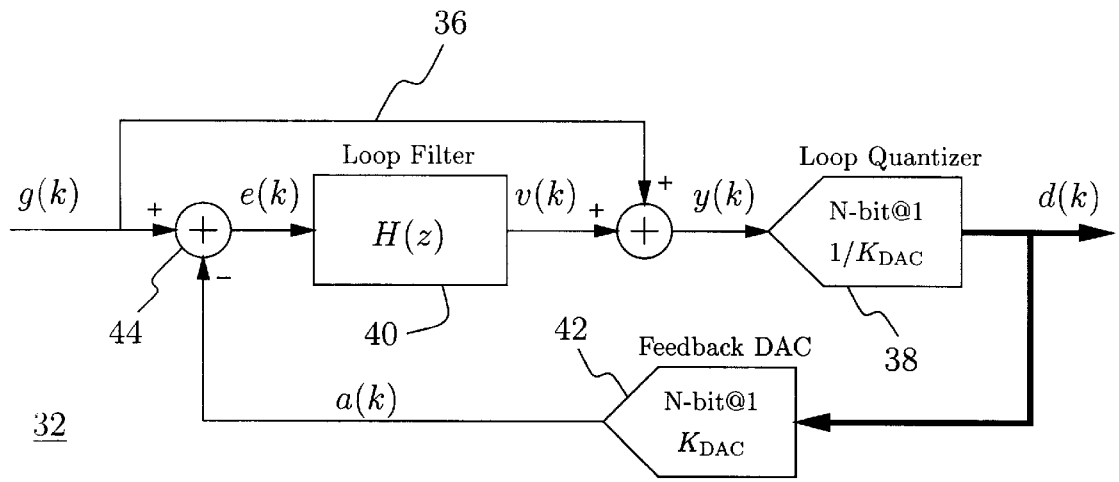

FIG. 2 shows the general topology of a delta-sigma modulator [32]. The feedback DAC [42] generates an analog feedback signal a(k) which must be a very accurate representation of d(k) in the signal band. An analog adder/subtractor [44] calculates the difference c(k) of the input signal g(k) and the analog feedback signal a(k). A linear loop filter [40] selectively amplifies e(k) in the signal band. The amplified error signal v(k) is fed to the loop quantizer [38] generating d(k), whereby the loop is closed. Assuming stability, the error signal's e(k) spectral power density will be inversely proportional the loop filter's [40] gain. Thus, using a high-gain loop filter [40] the signal-band power of e(k) can be made negligible, whereby the signal-band equivalence of d(k) and g(k) will be as good as the feedback DAC's [42] linearity.

According to the above discussion, it is preferable that the loop quantizer's [38] resolution N be as high as possible. However, to preserve stability, the loop quantizer's [38] and the feedback DAC's [42] combined delay may not exceed one clock cycle. Fast (low-latency) high-resolution quantizer's are generally massive circuits with a high power consumption; the use of them should be avoided, if possible. High-resolution quantizers are most easily implemented as multi-step quantizers, but their throughput (i.e., the maximum sampling frequency) is relatively low unless pipeline techniques are employed. Pipelined quantizers, however, cannot be used to implement the loop quantizer [38] because their delay will make the closed-loop delta-sigma modulator [32] unstable. It should also be considered that the feedback DAC [42] must provide a very linear D/A conversion, i.e., it should preferably be mismatch-shaping. Mismatch-shaping DACs require that some numerical computations be performed, which will further increase the loop delay. The performance of mismatch-shaping DACs can generally be improved if they are allowed some latency (say, two clock cycles).

3 SUMMARY

A delta-sigma modulator according to this invention comprises a pipelined multi-step quantizer quantizing the sum of the input signal g(k) and the loop filter's output signal v(k). Only the multi-step quantizer's last stage is used to quantize the loop filter's output v(k), thus adding only very little to the loop delay. The loop filter is implemented as a multi-path mixed-delay feedback structure allowing the feedback DAC several clock cycles of latency without compromising the modulator's stability.

3.1 Objects and Advantages

Accordingly, several objects and advantages of the invention are to provide a stable delta-sigma modulator structure in which a pipelined multi-step quantizer is used for the generation of a high-resolution output signal;

to provide a stable delta-sigma modulator structure for which the latency of the critical feedback DAC may be several clock cycles, thus facilitating the use of low-power digital circuitry to implement mismatch-shaping algorithms in high-speed delta-sigma ADCs;

to provide a delta-sigma modulator structure suitable for high-resolution A/D conversion of signals with a bandwidth of several mega Hertz;

to provide a simple delta-sigma modulator structure providing a high-resolution output signal;

to provide a delta-sigma A/D converter system for which the decimation filter can be greatly simplified, thus reducing the overall power consumption;

to provide a delta-sigma modulator structure optimized such that critical operations are allowed latency, and such that low-latency operations may cause relatively large errors without significantly deteriorating the overall performance.

Further objects and advantages will become apparent from a consideration of the ensuing description, the drawings, and the claims.

4 DRAWING FIGURES

FIG. 1: shows a general N-bit delta-sigma A/D converter system (PRIOR ART).

FIG. 2: shows an N-bit delta-sigma modulator (PRIOR ART).

Figure 3:
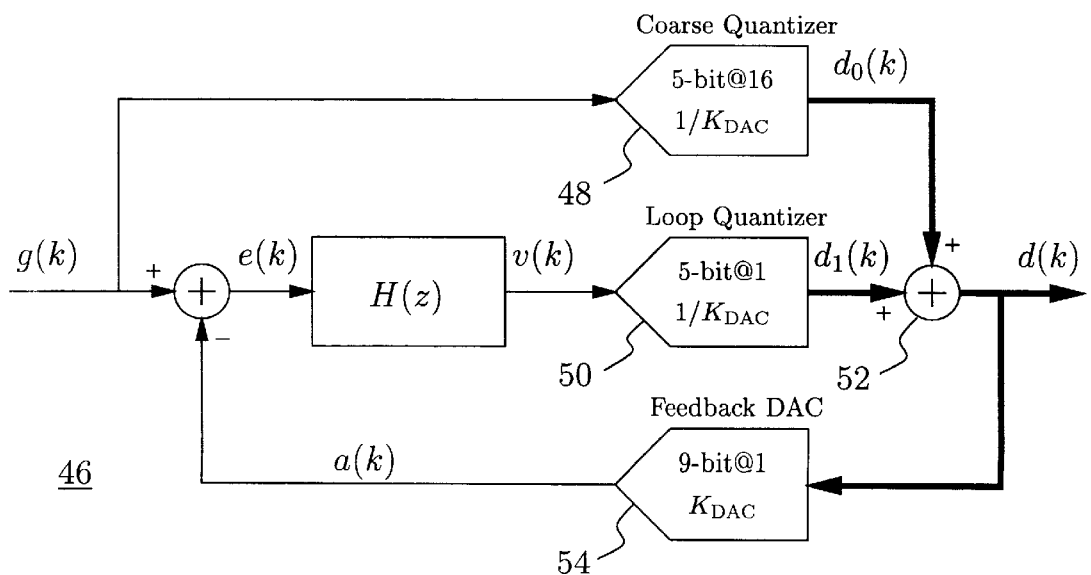

FIG. 3: shows a first embodiment of this invention.

Figure 4:
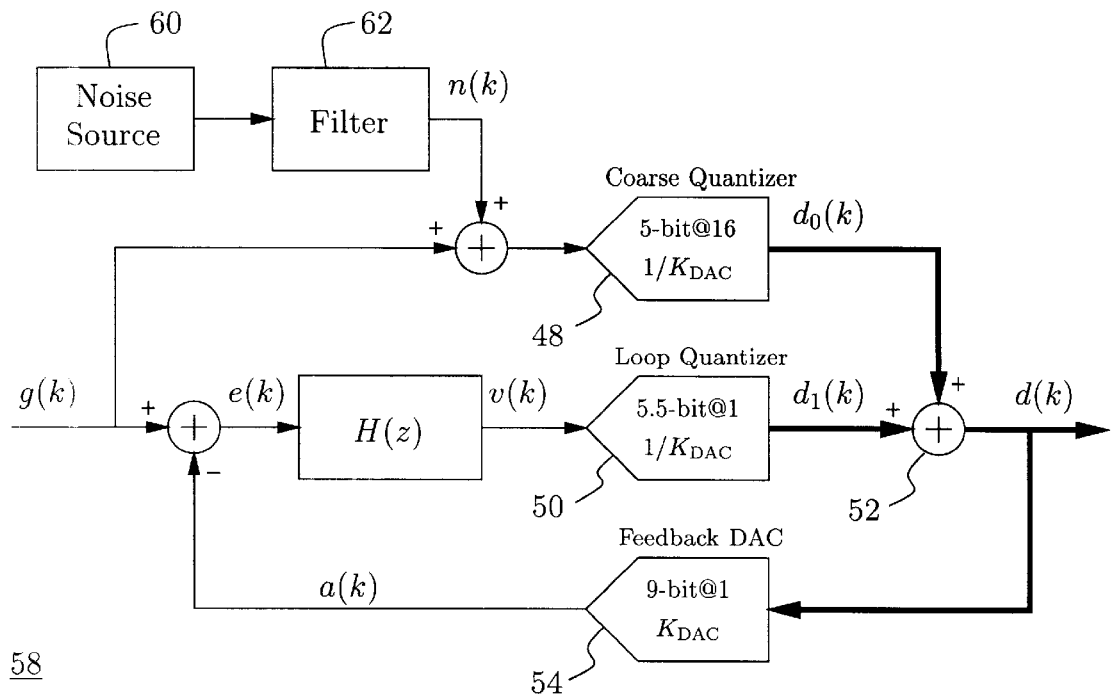

FIG. 4: shows a variation of the first embodiment with reduced distortion.

Figure 5:
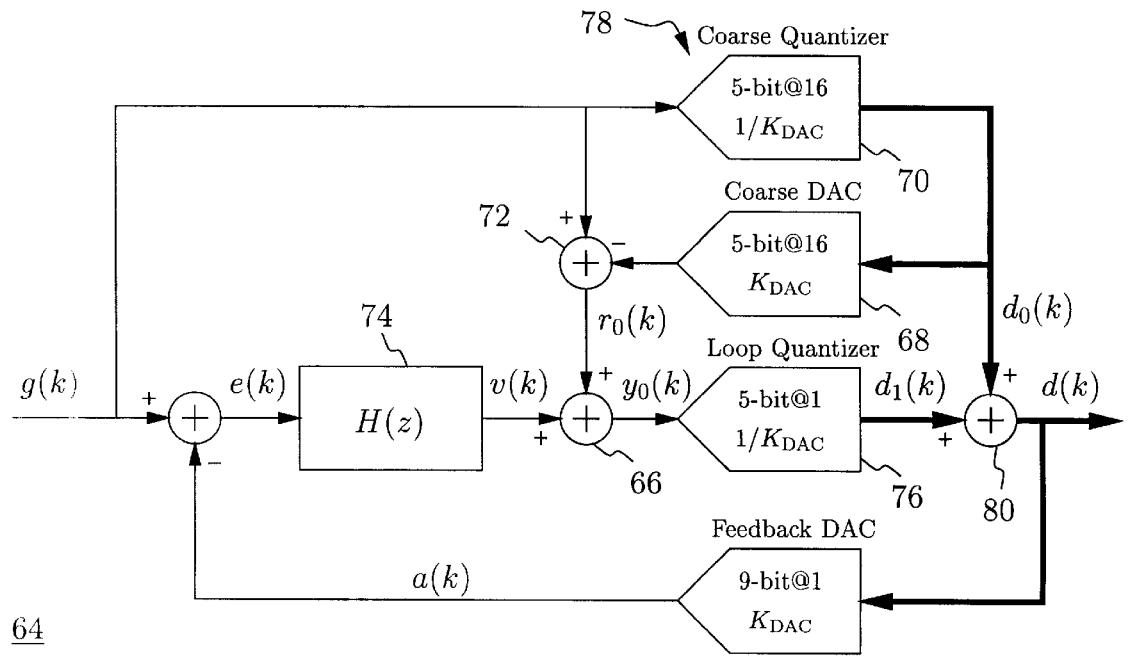

FIG. 5: shows a second embodiment of this invention.

Figure 6:
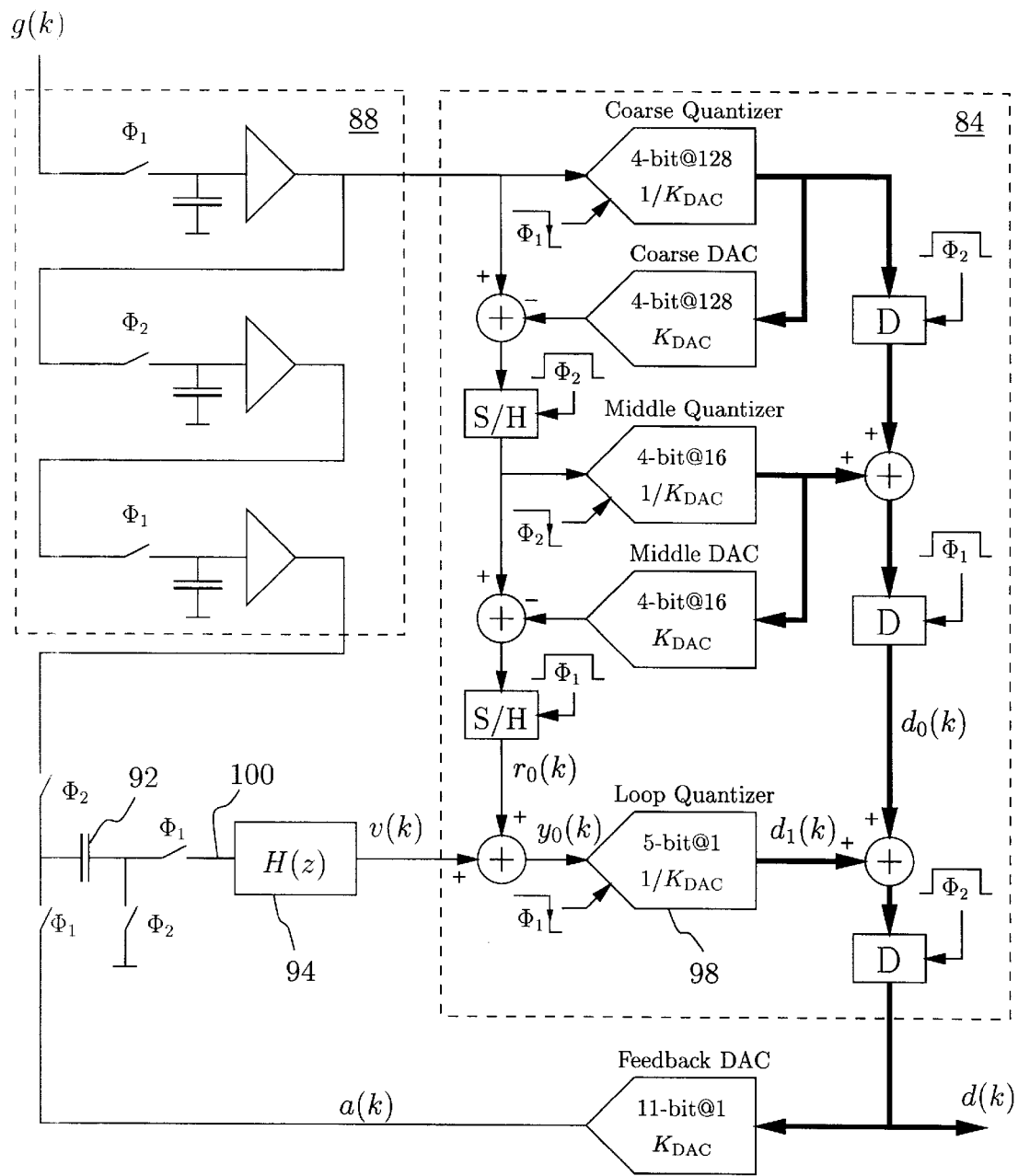

FIG. 6: shows a variation of the second embodiment using a pipelined quantizer.

Figure 7:
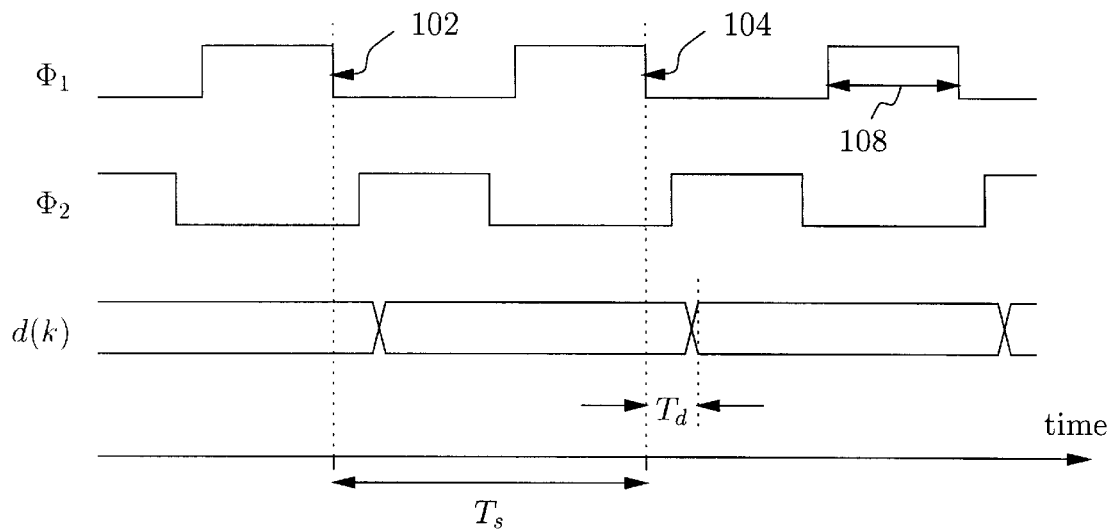

FIG. 7: shows the two-phase clock signals used for all embodiments of this invention.

Figure 8:
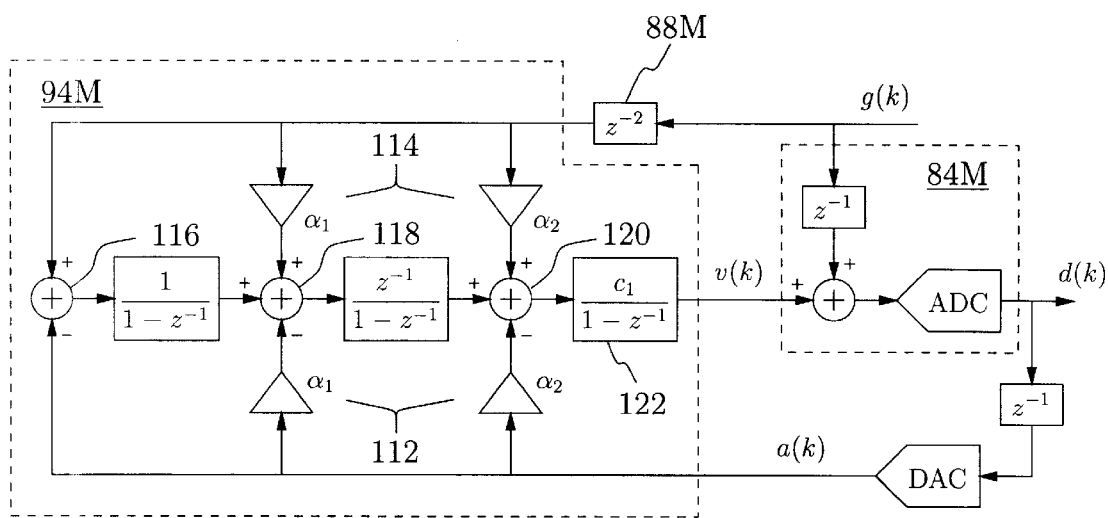

FIG. 8: shows a signal-flow model of the second embodiment (corresponds to FIG. 6).

Figure 9:
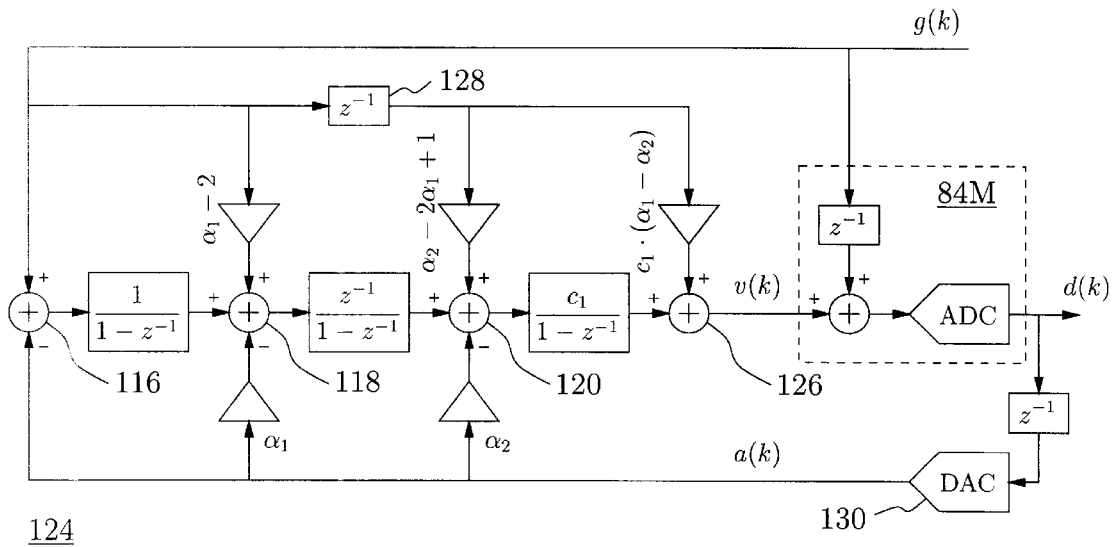

FIG. 9: shows an improved version of the second embodiment for which the most sensitive signals are applied directly to the loop filter.

Figure 10:
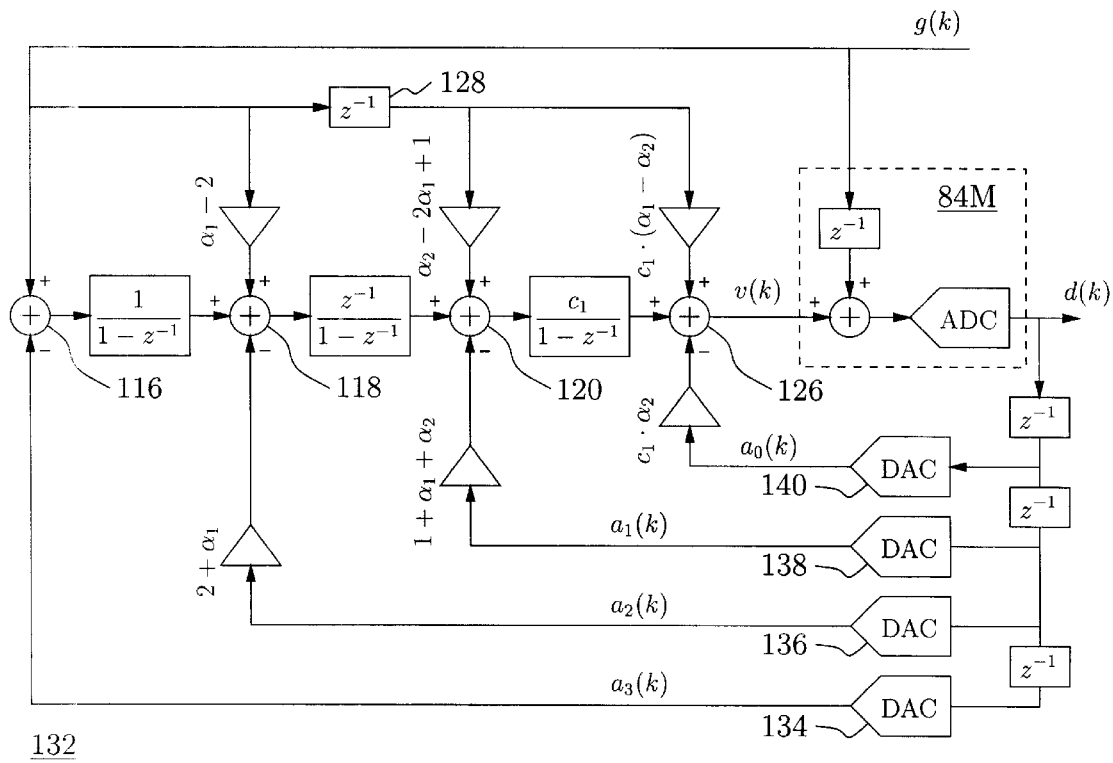

FIG. 10: shows a further improved version of the second embodiment allowing the most critical feedback DACs multiple clock cycles of latency.

Figure 11:
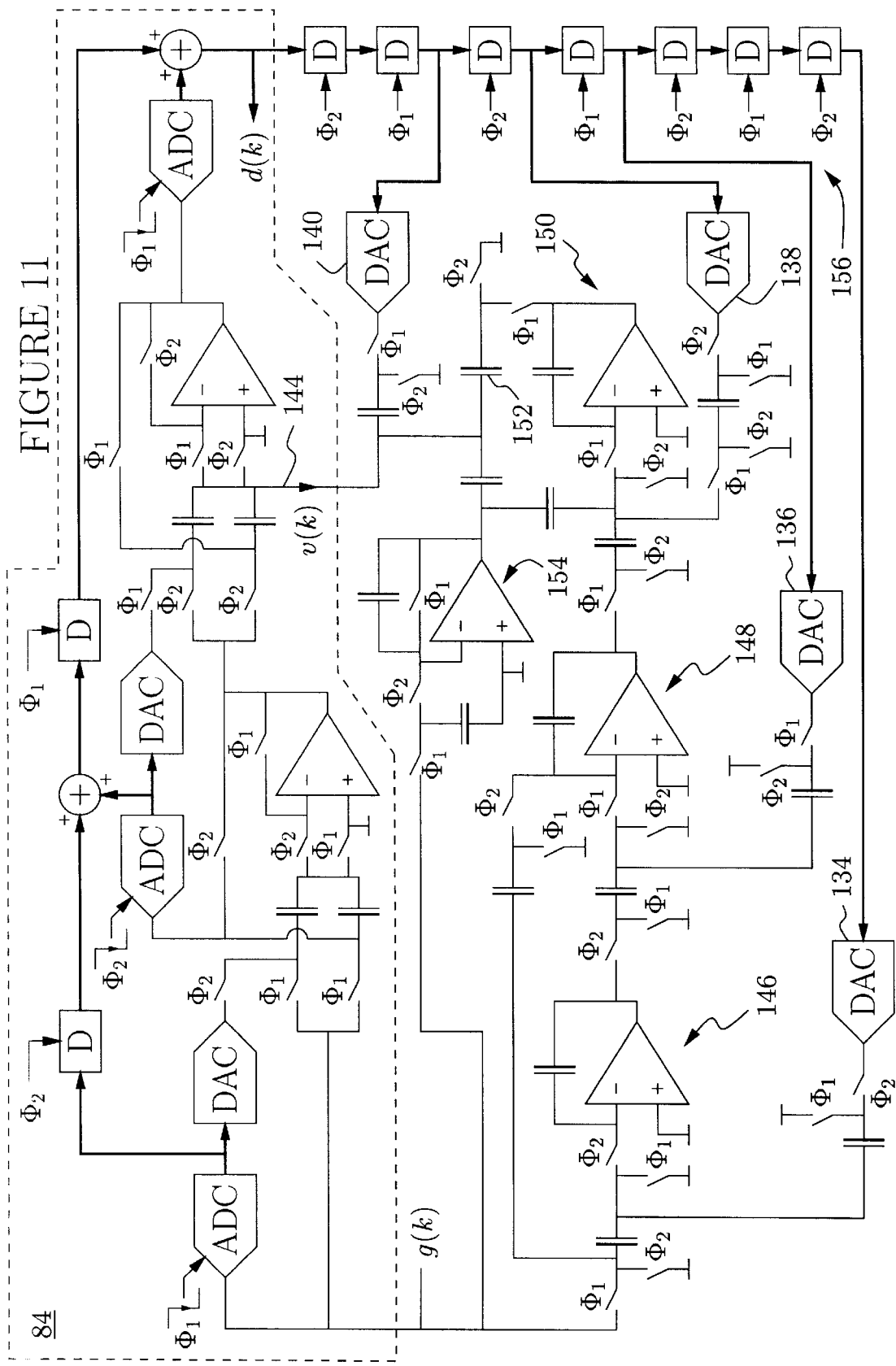

FIG. 11: shows a switched-capacitor implementation of the most preferred second embodiment (equivalent to FIG. 10).

Figure 12:
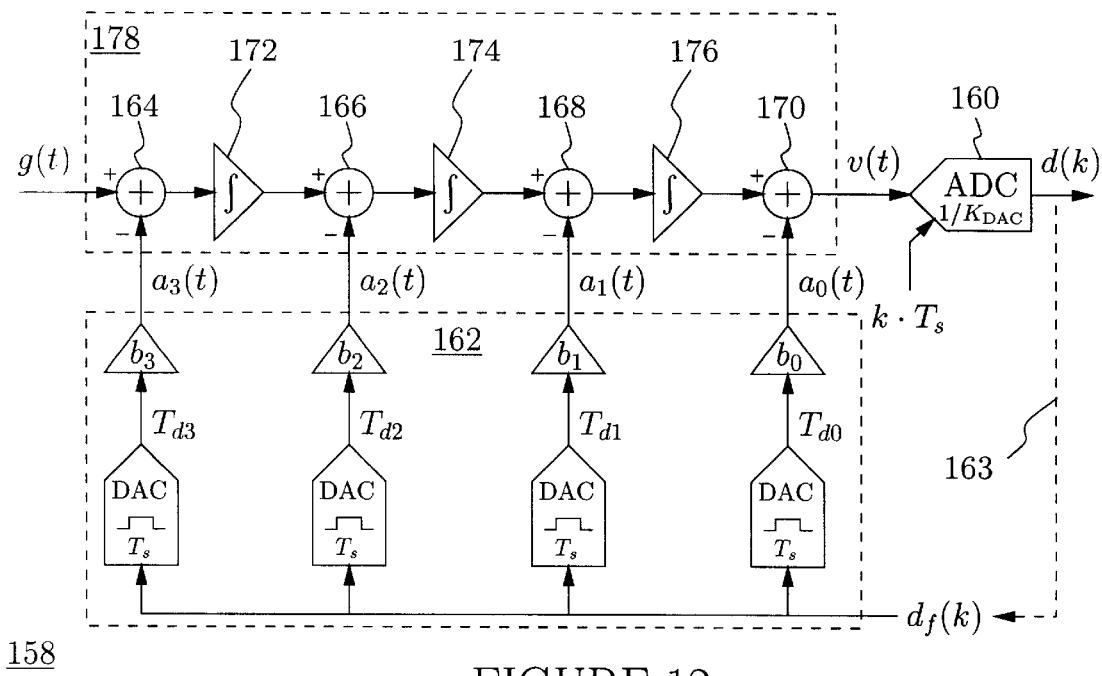

FIG. 12: shows the closed-loop portion of a third preferred embodiment: a continuous-time delta-sigma modulator.

Figure 13:
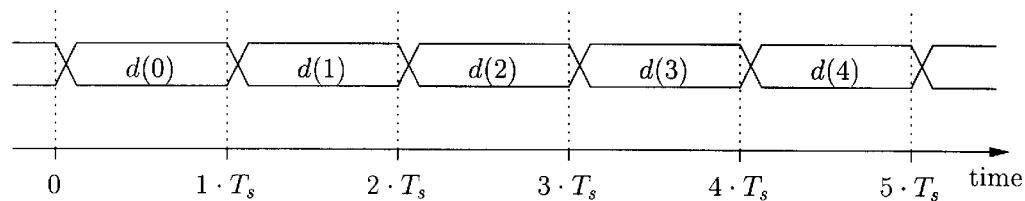

FIG. 13: shows when the digital output signal changes (third embodiment).

Figure 14:
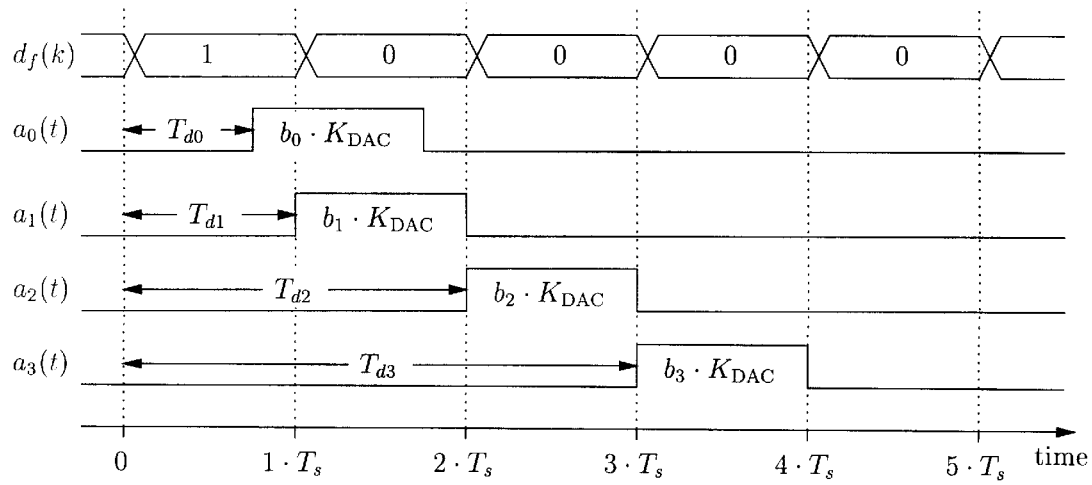

FIG. 14: shows the impulse responses of the feedback DACs (third embodiment).

Figure 15:
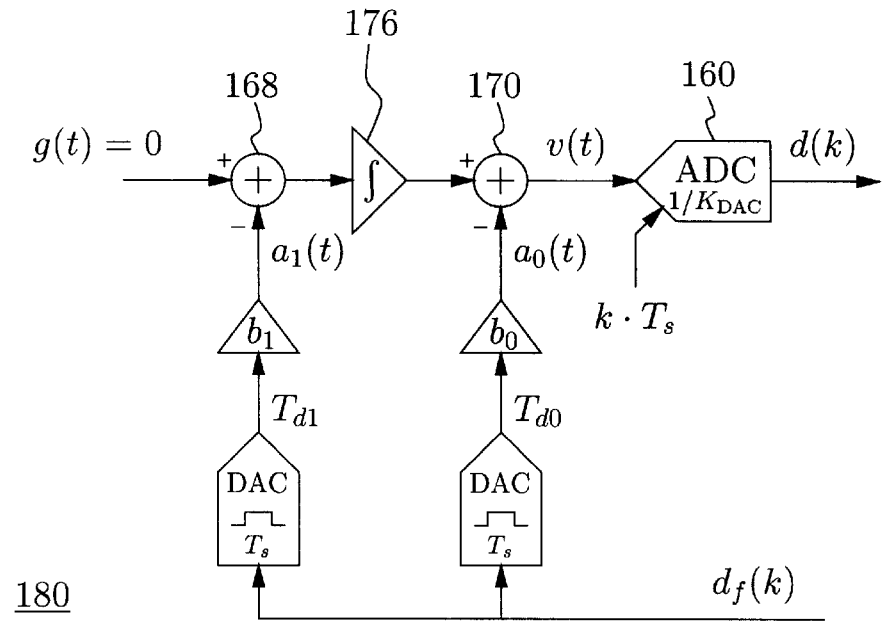

FIG. 15: shows a first-order continuous-time delta-sigma modulator (open-loop configuration).

Figure 16:
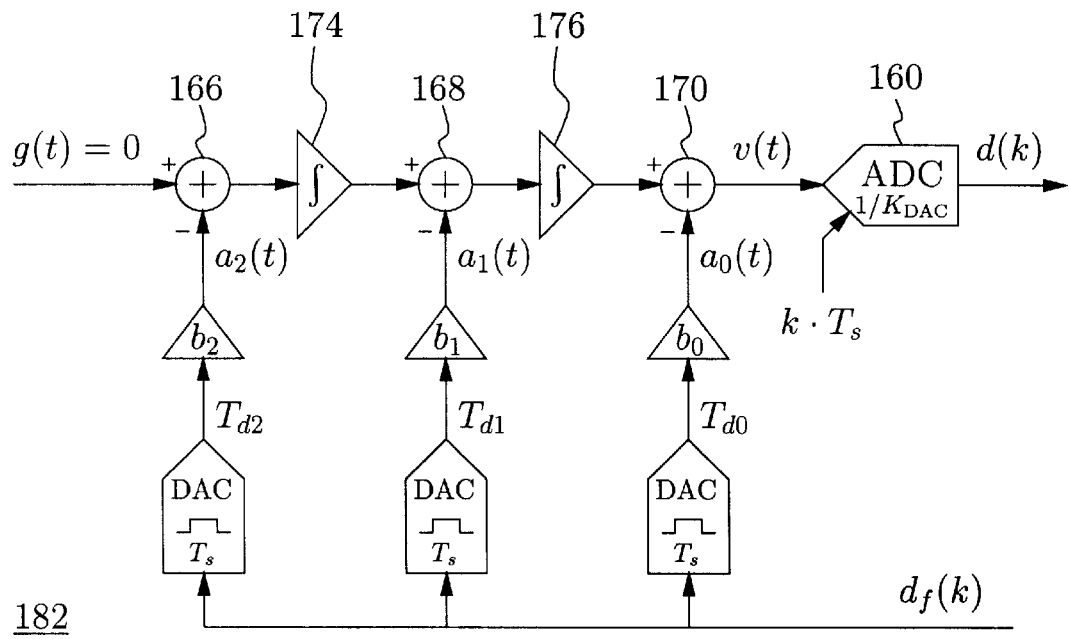

FIG. 16: shows a second-order continuous-time delta-sigma modulator (open-loop configuration).

Figure 17:
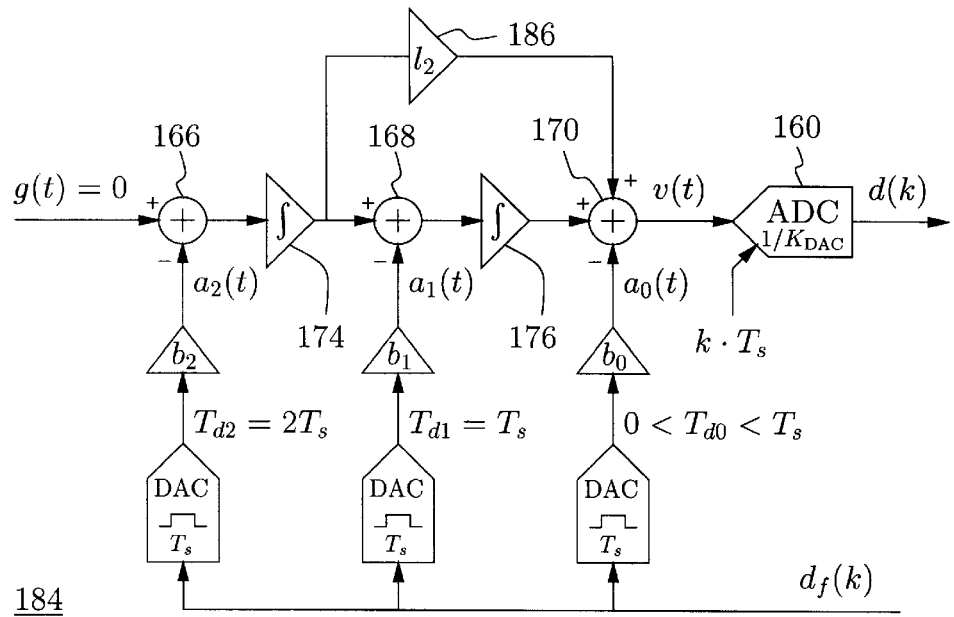

FIG. 17: shows a second-order continuous-time delta-sigma modulator with an extra feedforward signal path (open-loop configuration).

Figure 18:
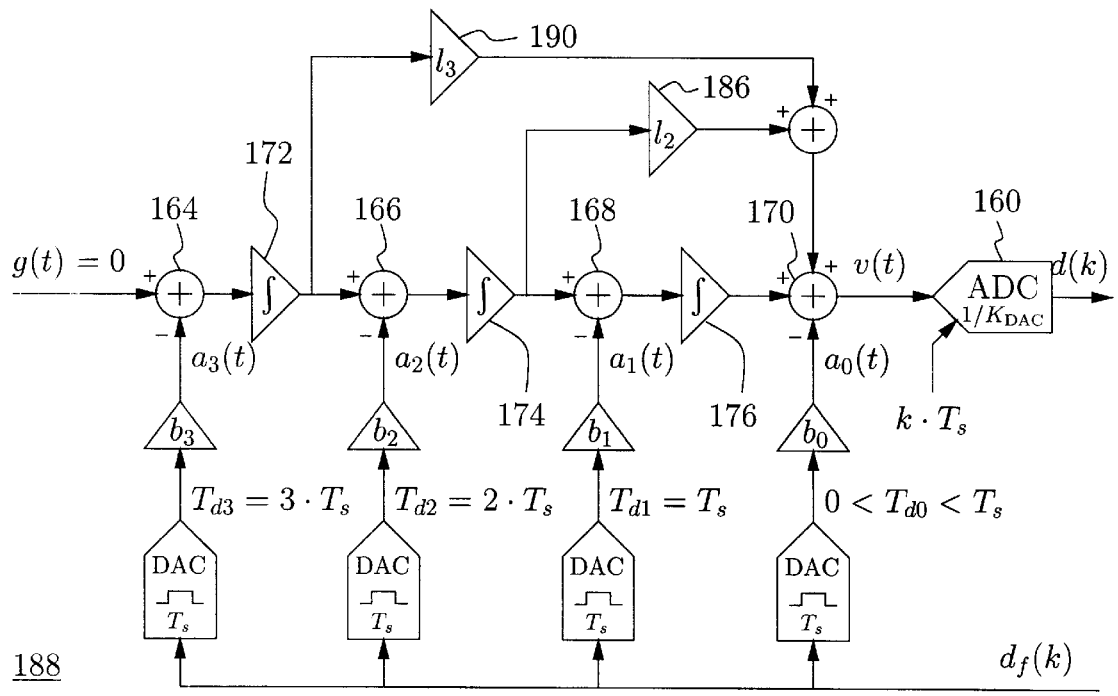

FIG. 18: shows a third-order continuous-time delta-sigma modulator with two extra feedforward signal paths (open-loop configuration).

FIG. 19: shows the numerator of the open-loop frequency response (z-transformed) of the modulator shown in FIG. 18.

FIG. 20: shows a third-order continuous-time delta-sigma modulator with three extra feedforward signal paths (open-loop configuration).

FIG. 21: shows the numerator of the open-loop frequency response (z-transformed) of the modulator shown in FIG. 20.

FIG. 22: shows the overall topology of the third preferred embodiment.

Figure 23:
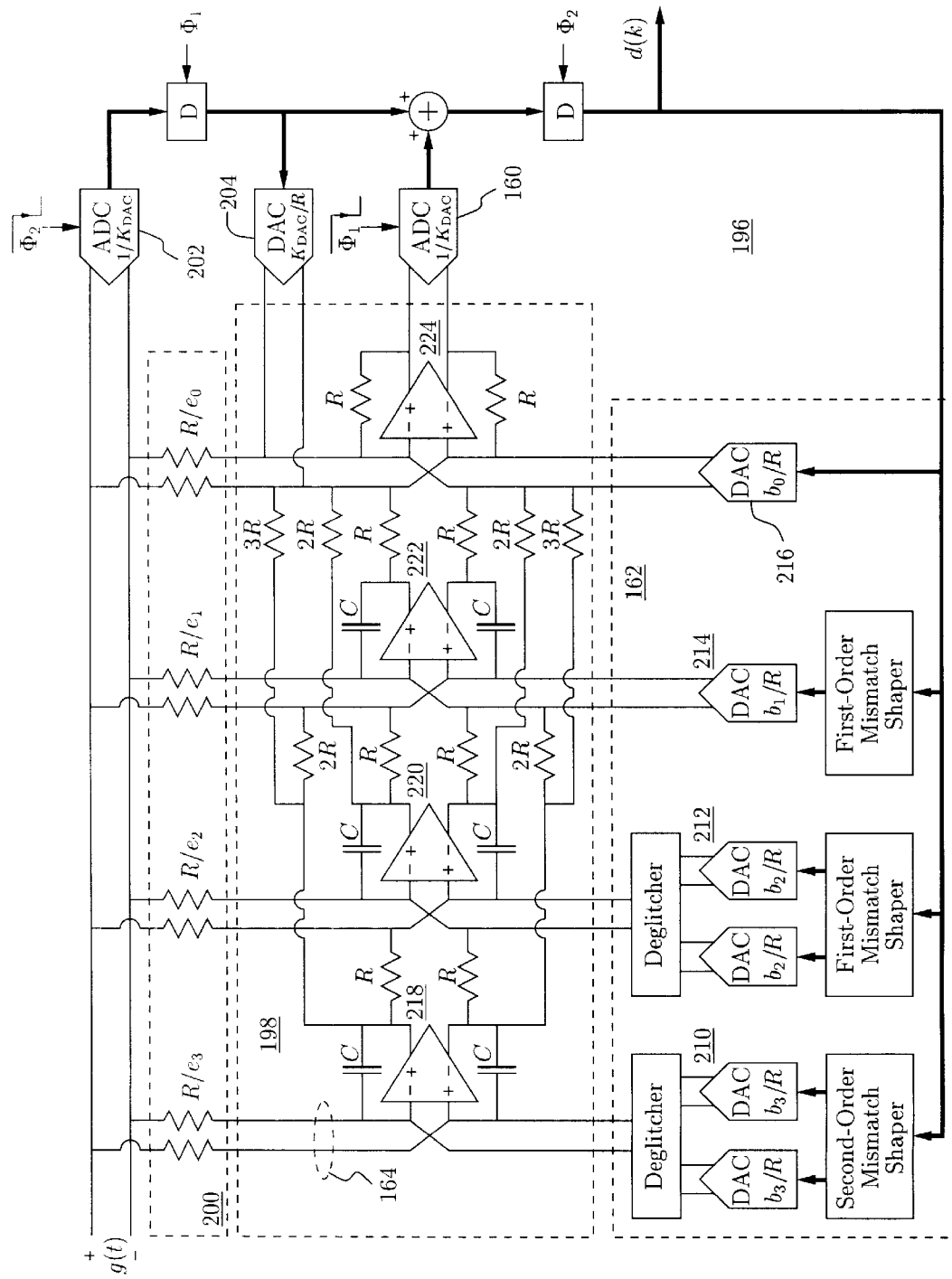

FIG. 23: shows the detailed implementation of the third preferred embodiment.

Figure 24:
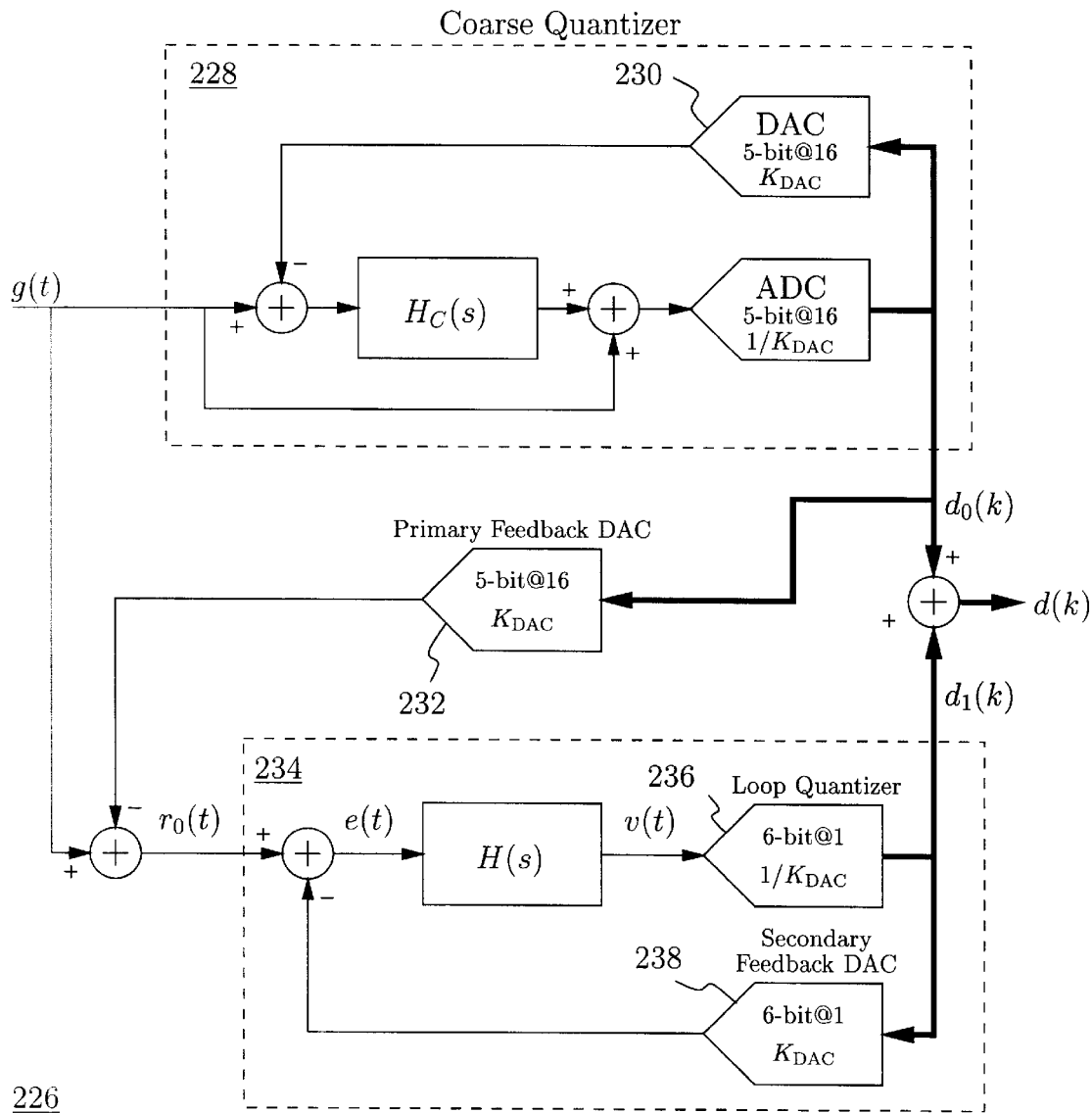

FIG. 24: shows the overall topology of a fourth preferred embodiment.

Figure 25:
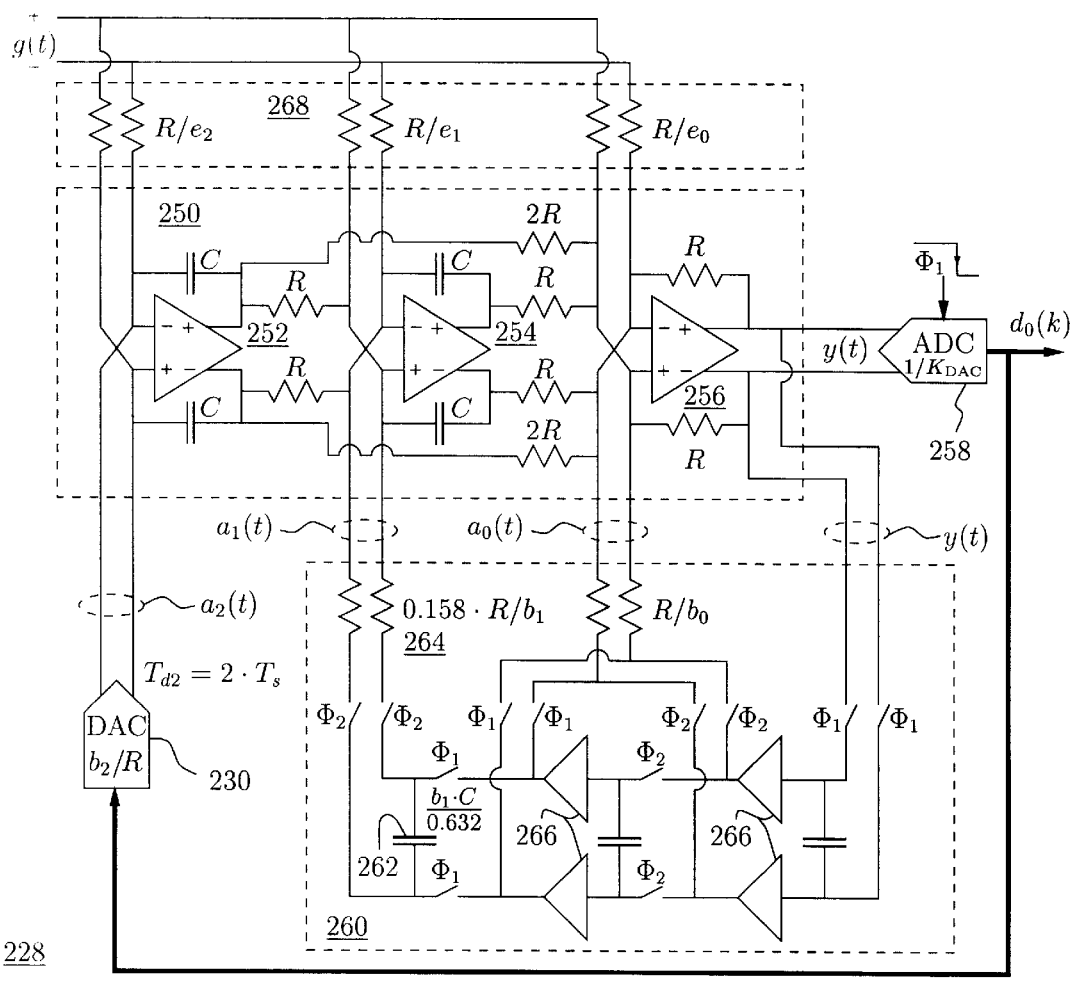

FIG. 25: shows the coarse quantizer used in the fourth embodiment.

Figure 26:
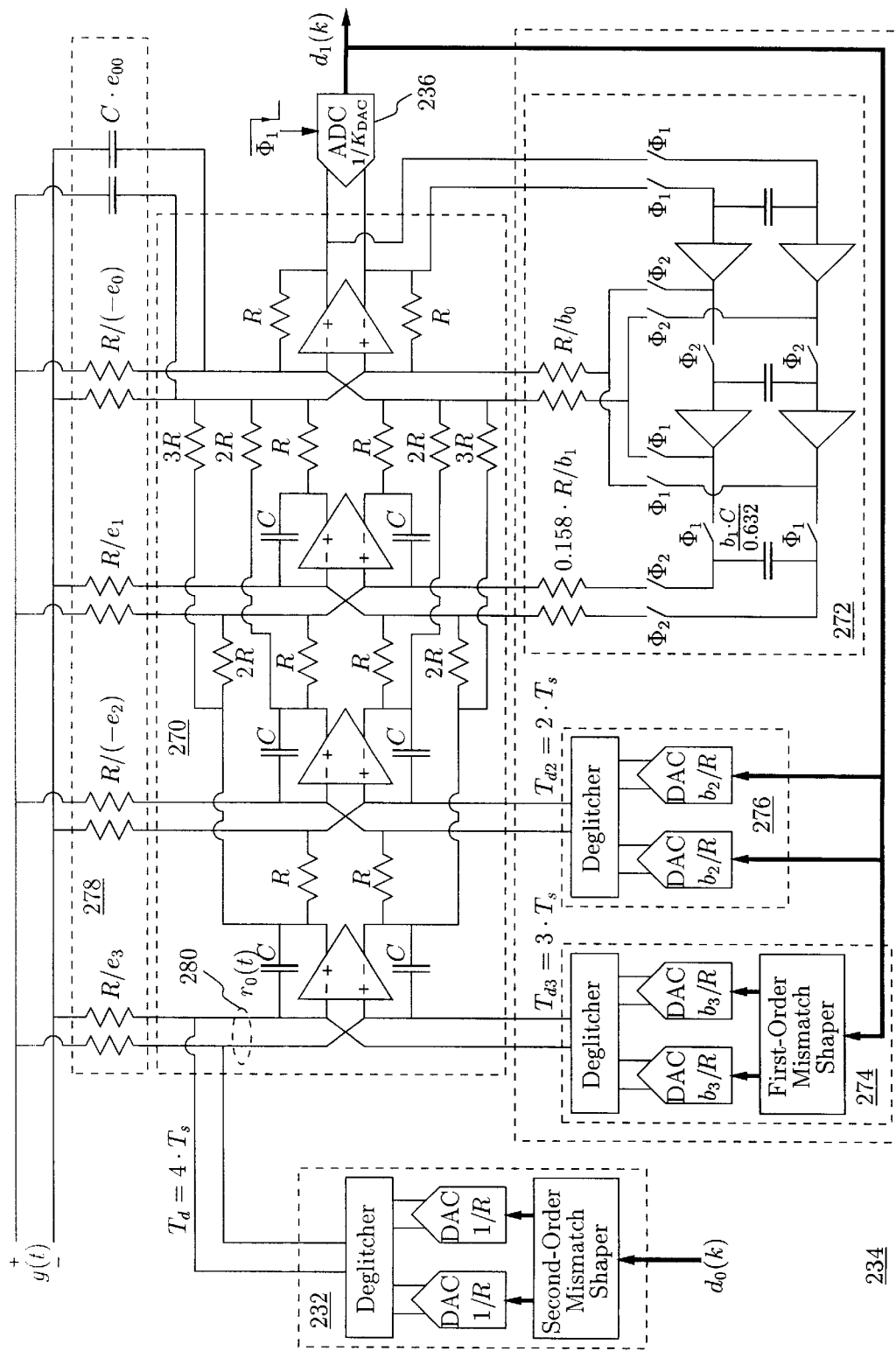

FIG. 26: shows the main delta-sigma quantizer used in the fourth embodiment.

Figure 27:
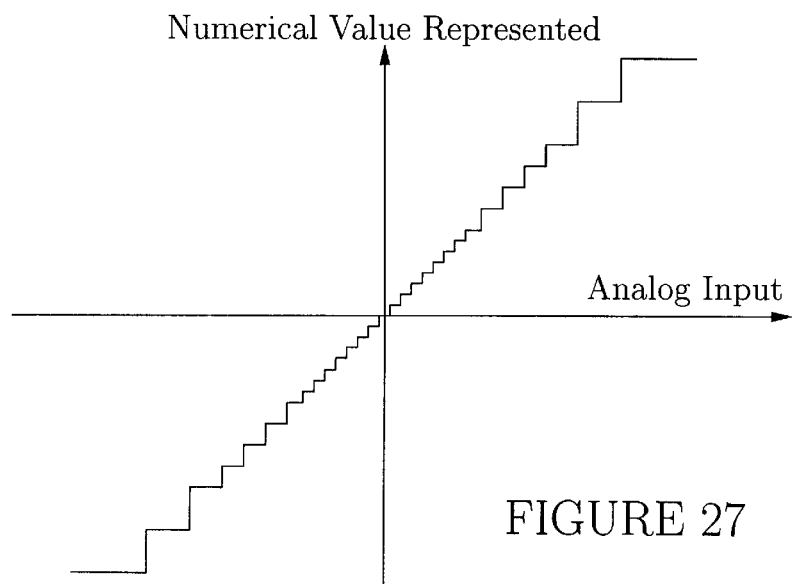

FIG. 27: shows the transfer characteristic of a data quantizer with a nonuniform step size.

5 DESCRIPTION of PREFERRED EMBODIMENTS

FIG. 2 shows a delta-sigma modulator [32]. Although the feedforward path [36] is not a new discovery, its advantages are not generally appreciated and it is usually not implemented. The feedforward path [36] adds the input signal g(k) to the loop filter's [40] output signal v(k), the sum of which y(k) is quantized by the N-bit loop quantizer [38]. Thus, d(k) is a N-bit approximation of y(k)=g(k)+v(k).

The loop quantizer's [38] step size (i.e., the weight of the least significant bit in d(k)) is defined to be one. The average increment of y(k) which will increase d(k) by one is defined as the loop quantizer's [38] unit analog quantity: 1 LSB. The loop quantizer's [38] gain $1/K_{DAC}$ is defined as the ratio of the step size (here defined as 1) divided by 1 LSB. For example, an ideal 6-bit loop quantizer [38] for which 1 LSB=30 mV is able to resolve y(k) in a range which is 1.920 Volts wide (the resolving range). The feedback DAC's [42] nominal gain $K_{DAC}$ is assumed to be reciprocal of the loop quantizer's [38] gain. Thus, a(k)=y(k)+q(k), where q(k) is a small quantization error caused by the loop quantizer's [38] finite resolution N. In the ideal case, the peak-to-peak magnitude of q(k) is 1 LSB.

An important advantage associated with the feedforward path [36] is that the relationship e(k)=v(k)+q(k) is valid when the loop quantizer [38] and the feedback DAC [42] are nondelaying. Because the quantization error q(k) is bounded in magnitude, approximately ±0.5 LSB, the implication of e(k)=v(k)+q(k) is that the magnitude of e(k) and v(k) are functions only of the loop quantizer's [38] input-referred step size, 1 LSB, and the loop filter's [40] frequency response H(z). Notice, in particular, that the input signal's g(k) magnitude and spectral composition is not part of the equation. As described by R. Schreier [Richard Schreier, "Mismatch-Shaping Digital-to-Analog Conversion," paper 4529 (E-1) presented at the 103rd Audio Engineering Society convention], the room-mean-square (RMS) value of v(k) is generally only a few LSBs, depending on how the loop filter's [40] frequency response H(z) is designed.

Consider the operation of a delta-sigma modulator [32] implemented in the topology shown in FIG. 2 comprising a high-resolution loop quantizer [38]. Observe that only a small fraction of the loop quantizer's [38] resolving range is used to quantize v(k); the vast majority of the signal swing in y(k) is caused by the input signal g(k). Observe also that g(k) is not part of the closed-loop structure, whereas v(k) is. An aspect of this invention is the generation of a high-resolution representation d(k) of y(k)=g(k)+v(k) using a multi-step quantization technique delaying v(k) only minimally.

5.1 Description of a First Preferred Embodiment

FIG. 3 shows a first preferred embodiment [46] of this invention. A coarse 5-bit quantizer [48] with step size 16 is used to generate a first approximation $d_0(k)$ of the input signal g(k). A 5-bit loop quantizer [50] with step size 1 is used to quantize v(k) to a digital representation $d_1(k)$. The two digital signals are combined by a digital adder [52] calculating the digital output signal $d(k)=d_0(k)+d_1(k)$ representing g(k)+v(k). Because the two quantizers [48] and [50] have different step sizes, the digital output signal d(k) will span approximately $2^9=512$ different codes, thus the feedback DAC [54] must have about 9 bits of resolution.

One interpretation of this modulator [46] is that it is a two-step quantizer. In that interpretation, the first-step quantization $d_0(k)$ is performed by the coarse quantizer [48], and the second-step quantization $d_1(k)$ is performed by a delta-sigma quantizer with input $g(k)-d_0(k)\cdot K_{DAC}$. This interpretation facilitates the observation of a small potential problem.

The delta-sigma quantizer performing the second-step quantization $d_1(k)$ does not comprise the feedforward path [36] shown in FIG. 2, thus $d_1(k)$ will be delayed slightly with respect to $g(k)-d_0(k)\cdot K_{DAC}$. The delay is frequency-dependent. Simulations indicate that the modulator [46] will operate very well when the oversampling ratio is relatively high (which implies that the sample-to-sample variations in g(k) are relatively small), but also that the frequency spectrum of d(k) may be tonal when the oversampling ratio is very low, say 10. These tones are, in reality, harmonic distortion generated because $d_0(k)$, and thus also $g(k)-d_0(k)\cdot K_{DAC}$, comprise harmonic distortion of g(k). Due to the delay discussed above, $d_1(k)$ does not compensate effectively for high-frequency spectral components in $g(k)-d_0(k)\cdot K_{DAC}$, including harmonic distortion.

Improved Version Comprising Dithering

Although the modulator [46] shown in FIG. 3 per se is very useful for moderate-to-highly oversampled applications, it is generally preferable to avoid the distortion in $d_0(k)$, e.g., by dithering the coarse quantizer [48]. This simple technique can be implemented as shown in FIG. 4. A noise signal n(k) is added to g(k), and the sum is quantized by the coarse quantizer [48]. The noise signal's n(k) magnitude should be approximately as large as the coarse quantizer's [48] LSB, i.e., $16\cdot K_{DAC}$, and the loop quantizer's [50] resolving range must be increased accordingly. It is preferable if n(k) has only little power in the signal band. The desired spectral composition of n(k) can be obtained using a broadband noise source [60] followed by a filter [62] suppressing the undesired (signal-band) spectral components. The noise source [60] and the filter [62] can, for example, be implemented as a digital noise-shaping loop and a simple DAC (not shown). A better technique is to generate $d_0(k)$ using a separate delta-sigma quantizer of the type shown in FIG. 3. This technique will be discussed separately (fourth embodiment).

5.2 Description of a Second Preferred Embodiment

FIG. 5 shows a second preferred embodiment [64], which very efficiently overcomes the potential distortion problem discussed above. The only, but very important, difference is that the residue $r_0(k)=g(k)-d_0(k)\cdot K_{DAC}$ of the coarse quantization $d_0(k)$ of g(k) is added to the loop filter's [74] output signal v(k) using an analog adder [66]. The residue $r_0(k)$ is calculated as follows. A coarse D/A converter [68] with the same resolution and reciprocal gain as that of the coarse quantizer [70] generates the analog equivalent of $d_0(k)$, which is subtracted from the input signal g(k) using an analog adder/subtractor [72]. The sum $y_0(k)$ of $r_0(k)$ and v(k) is quantized to $d_1(k)$ by the 5-bit loop quantizer [76]. The system's [64] digital output signal d(k) is obtained by adding the two partial quantizations $d(k)=d_0(k)+d_1(k)$.

Provided that the loop quantizer [76] is not overloaded, the result d(k) is equivalent to a two-step 9-bit quantization of g(k)+v(k), which is the desired operation (compare to FIG. 2). It is important to understand the requirements for not overloading the loop quantizer [76]. Clearly, if v(k)=0, the coarse quantizer [70], the coarse DAC [68], the subtractor [72], the loop quantizer [76], and the adder [80] in combination implement a traditional two-step quantizer [78]. The two-step quantizer [78] employs digital correction because the loop quantizer's [76] resolving range ($32\cdot K_{DAC}$) is wider than the residue signal's $r_0(k)$ theoretical maximum span ($16\cdot K_{DAC}$). Hence, the two-step quantizer [78] will operate correctly even if the coarse quantizer's [70] transition levels are misplaced by as much as $\pm 8\cdot K_{DAC}$. Assuming that the coarse quantizer [70] is somewhat better than that, say that the transition levels are known to be misplaced by less than $\pm 4\cdot K_{DAC}$, some margin, $\pm 4\cdot K_{DAC}$, is left for variations in v(k). Thus, provided that the maximum signal swing of v(k) is known, the quantizer [78] can easily be designed such that d(k) will represent g(k)+v(k) with the expected 9-bit accuracy.

Still assuming that variations in g(k) affect immediately the value of a(k), the peak-to-peak value of v(k) will generally be in the range from (say) ±2LSB to ±8LSB, depending on how the loop filter's [74] frequency response H(z) is designed (cf. the paper by R. Schreier cited above). Thus, when using a very aggressive loop filter [74] it may be necessary to increase the loop quantizer's [76] resolution and/or decrease the coarse quantizer's [70] step size. However, for most loop filters [74] 5-bit resolution is sufficient for the loop quantizer [76].

It should be understood that the magnitude of v(k) may increase significantly if there is a delay from g(k) to a(k). This situation must be avoided. Clearly, the loop quantizer [76] should not be strobed until after the coarse quantizer [70] is strobed and the corresponding value $y_0(k)$ has been calculated with the required accuracy. The time required to perform these operations is often in the range from (say) 25 to 50 nS (nanoseconds). Thus, the delay from when the coarse quantizer [70] is strobed and until a(k) is made available may be as much as 50–100 nS, and that may constrain significantly the maximum frequency at which the modulator [64] can be clocked. Pipeline techniques can be used to increase the sampling frequency, and thus the signal bandwidth. FIG. 6 shows how.

5.2.1 Pipelined Version

FIG. 6 shows a pipelined delta-sigma modulator system [82]. The digital output signal's d(k) physical resolution is 11 bits, thus a very high effective resolution (say, 16 bits) can be obtained using only little oversampling (say, 10 times) and a low-order loop filter [94].

A three-step pipeline quantizer [84] generates a digital representation d(k) of the sum of the input signal g(k) and the loop filter's [94] output signal v(k). FIG. 7 shows a timing diagram of the operation. The input signal g(k) is sampled at a trailing edge [102] of a first clock signal $\Phi_1$. The pipeline quantizer's [84] last stage, i.e., the loop quantizer [98], is strobed at the next trailing edge [104] of the same clock signal. Thus, the digital representation d(k) of the input signal g(k) sampled at the first trailing edge [102] is available a short delay $T_d$ after the second trailing edge [104]. In other words, the pipeline quantizer [84] causes slightly more than one clock cycle $T_s$ of delay with respect to g(k). However, the loop filter's [94] output signal v(k) is quantized only by the pipeline quantizer's last stage [98], and the delay $T_d$ from v(k) to d(k) is, therefore, minimal.

The loop filter [94] is implemented as a switched-capacitor filter. The filter's [94] input capacitor [92] is shown separately. Thus, the loop filter's input terminal [100] is at a constant potential (virtual ground). The loop filter's [94] input signal e(k) is represented by the charge flowing out of the input terminal [100] when the first clock signal $\Phi_1$ is logically 'high'.

Consider again the timing diagram shown in FIG. 7. The analog feedback signal a(k) corresponding to the input signal g(k) sampled at the first trailing edge [102] is comprised in the error signal e(k) provided to the loop filter [94] in the time period [108] following the second trailing edge [104]. Thus, to assure that the magnitude of v(k) is essentially independent of g(k), the input signal sampled at the first trailing edge [102] must be delayed and fed to the loop filter [94] in the same time period [108] as the corresponding feedback signal a(k) is. The required delay can be obtained, for example, using an analog delay line [88].

Alternatives to using an Analog Delay Line.

The analog delay line [88] can be implemented according to the prior art in several ways, but considering that analog signal processing always will deteriorate the signal-to-noise ratio, it is preferable to apply the input signal g(t) directly to the loop filter [94]. The following discussion will describe how the analog delay line [88] can be substituted by a modification of the loop filter [94].

FIG. 8 shows a signal-flow model [110] of the delta-sigma modulator system [82]. The analog delay line [88] and the three-step pipeline quantizer [84] are here represented by the simpler models [88M] and [84M]. The loop filter [94] is a third-order switched-capacitor filter, which is here represented by a signal-flow model [94M]. The error signal e(k)=g(k)−a(k) is injected at three nodes, [116], [118], and [120], in the loop filter [94M]. The error signal injected at nodes [118] and [120] is respectively scaled with coefficients $\alpha_1$ and $\alpha_2$ by the gain stages [112] and [114]. It is important that the gain stages' [112] and [114] coefficients match in pairs. The proper choice of the coefficients $\alpha_1$ and $\alpha_2$ is well-known by those who are skilled in the art of designing delta-sigma noise-shaping loops. A good choice for many applications would be, e.g., $\alpha_1$=2.33 and $\alpha_2$=3.88. Gain scaling is, for simplicity, performed only in the third integrator [122], which is scaled by a coefficient $c_1$. The value of $c_1$ corresponding to the values of $\alpha_1$ and $\alpha_2$ suggested above is $c_1$=0.608.

Assume that the modulator [110] has been designed properly with matching coefficients of the gain stages [112] and [114]. The macroscopic performance depends only on the open-loop transfer functions $H_{gv}(z)$ from g(k) to v(k), where $$H_{gv}(z) = c_1 \cdot z^{-2} \left( \frac{z^{-1}}{(1-z^{-1})^3} + \frac{\alpha_1 \cdot z^{-1}}{(1-z^{-1})^2} + \frac{\alpha_2}{(1-z^{-1})^1} \right), \quad (1)$$

and $H_{dv}(z)$ from d(k) to v(k), where $$H_{dv}(z) = K_{DAC} \cdot c_1 \cdot z^{-1} \left( \frac{z^{-1}}{(1-z^{-1})^3} + \frac{\alpha_1 \cdot z^{-1}}{(1-z^{-1})^2} + \frac{\alpha_2}{(1-z^{-1})^1} \right). \quad (2)$$

Thus, it is simple to show that the delta-sigma modulator [124] shown in FIG. 9 macroscopically is equivalent to the delta-sigma modulator [110] shown in FIG. 8. The most important difference is that the analog delay line [88M] has been eliminated, thereby simplifying the system and improving the performance. In FIG. 9, the input signal g(k) is applied directly to the global input node [116], which is the most sensitive node of any delta-sigma modulator. The input signal g(k) is also injected directly to the first state-variable node [118], although now scaled by $(\alpha_1-2)$ instead of $\alpha_1$. An analog delay line [128] delays the input signal g(k) by one sample before it is injected to the second state-variable node [120], scaled by $(\alpha_2-2\alpha_1+1)$. The delayed input signal is also injected to the third state-variable node [126], scaled by $c_1 \cdot (\alpha_1-\alpha_2)$.

Errors caused by the introduced delay line [128] are less of a problem than errors caused by the eliminated delay line [88M] in FIG. 8. The reason is that errors injected into the nodes [120] and [126] will deteriorate the overall performance much less than similar errors injected into the more sensitive nodes [116] and [118]. Thus, the analog delay line [128] may be implemented using very simple circuitry.

Allowing Delay in the Feedback DAC

It is well understood that to avoid instability delta-sigma noise-shaping loops may cause at most one sample of delay. However, for multi-path feedback structures, such as the one shown in FIG. 9, the requirement refers to the minimum-delay loop only, i.e., in this case to the loop injecting $\alpha_2 \cdot a(k)$ to the second state-variable node [120]. The larger loops (injecting signals to nodes [116] and [118]), for which mismatch-shaping is needed most, may comprise more delay. For example, while still honoring the principle of not changing the macroscopic behavior, i.e., the transfer function $H_{dv}(z)$ from d(k) to v(k), the delta-sigma modulator [124] can be modified to the delta-sigma modulator [132] shown in FIG. 10.

In FIG. 10, the global feedback DAC [134] is (as always) subject to very strict linearity requirements. Hence, this DAC [134] should preferably be second-order mismatch-shaping and otherwise designed according to the state of the art. The global feedback signal $a_3(k)$ provided by this DAC [134] is delayed three clock cycles with respect to d(k), thus facilitating the use of even very numerically-complex mismatch-shaping algorithms. Less delay will generally be sufficient, but this embodiment illustrates that the modulator [132] can be designed to allow even very substantial delays.

Errors comprised in the analog feedback signal $a_2(k)$ provided by the second DAC [136] are less deleterious than errors comprised in the global feedback signal $a_3(k)$ are. Hence, the techniques used to improve this DAC's [136] linearity need not be as elaborate as those used for the global feedback DAC [134]. It is, therefore, sufficient that $a_2(k)$ is delayed only two clock cycles with respect to $d(k)$. The gain of the feedback path implemented by this DAC [136] should be $(\alpha_1+2) \cdot K_{DAC}$, where $\alpha_1 \cdot K_{DAC}$ is the gain of the equivalent feedback path in FIG. 9.

Errors caused by the third DAC [138] and the least significant DAC [140] are much less deleterious than errors caused by the global DAC [134]. Hence, the least significant DAC [140] need not perform mismatch shaping, and it is, therefore, sufficient that the analog signal $a_0(k)$ it provides is delayed only one clock cycle with respect to $d(k)$. The third DAC [138] may employ mismatch-shaping, but it is not strictly necessary. The introduction of the least significant DAC [140] and the increased gain of the second and third DACs, [136] and [138], is necessary to compensate for the delay introduced, i.e., without altering the transfer function from $d(k)$ to $v(k)$.

Switched-Capacitor Implementation

FIG. 11 shows the topology of a single-ended switched-capacitor circuit implementing the delta-sigma modulator [132] shown in FIG. 10. The general operation will be understood by those who are skilled in the art. The pipeline quantizer [84] is a traditional stage except that the charge signal $v(k)$ is added at node [144]. The two first integrators [146] and [148] provide one half clock cycle of delay each. The third integrator [150] is an inverting, nondelaying one. The inverted polarity is rectified by an inverting coupling to the pipeline quantizer [84] implemented by a capacitor [152]. The remaining stage [154] implements the analog delay line [128]. The long string of digital delays [156] will obviously be comprised in the DACs [134] [136] [138] [140]; otherwise there would be little point in the considered modification [132] of the delta-sigma modulator system [124].

For some values of the coefficients $\alpha_1$ and $\alpha_2$ the capacitance of one or more capacitors may become negative. However, this is easily rectified in a fully-differential implementation by interchanging the positive/negative signal paths.

5.3 Description of a Third Preferred Embodiment

This invention is most easily taught and understood for discrete-time delta-sigma modulators, but it is equally important and useful for continuous-time ones. It is believed that to efficiently teach the invention for continuous-time delta-sigma modulators, it is best to address the multiple design issues separately.

First, the stability of a continuous-time delta-sigma modulator with multi-path mixed-delay feedback will be addressed. Second, the design of the loop filter's input paths will be considered. Third, some considerations on the output signal's resolution will be provided.

5.3.1 Continuous-Time Modulator with Multi-Path Mixed-Delay Feedback

FIG. 12 shows a continuous-time delta-sigma modulator [158]. The input signal $g(t)$ can be a continuous waveform, i.e., it need not be a sampled-and-held signal. The loop filter's [178] output signal $v(t)$ is sampled by the loop quantizer [160] at times $t=k \cdot T_s$, where $k$ is integer and $T_s$ is the sampling period, say 10 nanoseconds. A timing diagram for the sampling operation is shown in FIG. 13. During normal operation, the modulator [158] operates as a closed-loop feedback system, i.e., the dashed line [163] connects the digital output signal $d(k)$ and the digital feedback signal $d_f(k)$ such that $d(k)=d_f(k)$.

An array of D/A converters [162] generate a set of analog feedback signals, $a_3(t)$, $a_2(t)$, $a_1(t)$, and $a_0(t)$, which are injected in the loop filter [178] at the input node [164] and at the state-variable nodes, [166], [168], and [170], respectively.

Choosing the Impulse Responses

Consider the situation where the loop has been opened by eliminating the signal path [163] connecting $d(k)$ and $d_f(k)$, and where $d_f(k)$ is a digital impulse signal, i.e., $d_f(0)=1$ and $d_f(k)=0$ for $k \neq 0$. The question is how the analog feedback signals $a_0(t)$, $a_1(t)$, $a_2(t)$, $a_3(t)$ should be generated. The objective is to allow the feedback signals which are most sensitive to errors, $a_3(t)$ and $a_2(t)$ (in that order), to be delayed with respect to the corresponding sampling instance at $t=0$. Thus, it is useful to define delay variables, $T_{d0}$, $T_{d1}$, $T_{d2}$, and $T_{d3}$, representing when, the corresponding feedback signals, $a_0(t)$, $a_1(t)$, $a_2(t)$, and $a_3(t)$, first become nonzero, i.e., the delay of the respective impulse responses. FIG. 14 shows a timing diagram where the delay variables, $T_{d3}$, $T_{d2}$, $T_{d1}$, and $T_{d0}$, are defined.

To obtain stability, the minimum-delay loop must have a delay of one clock cycle. The waveform of $a_0(t)$ is arbitrary; it is only the values at the sampling instances $a_0(k \cdot T_s)$ which matter. Thus, if $T_{d1}$, $T_{d2}$, and $T_{d3}$ are all $T_s$ or greater, $a_0(T_s)$ must be nonzero. For simplicity, it will be assumed that $a_0(k \cdot T_s)$ is nonzero for $k=1$ only (however, that is not a requirement).

The waveforms of the other feedback signals, $a_1(t)$, $a_2(t)$, and $a_3(t)$, affect the delta-sigma modulator's [158] dynamics significantly. For simplicity—and only for simplicity—it will be assumed that each of these feedback signals, $a_1(t)$, $a_2(t)$, and $a_3(t)$, provide a constant value ($b_1 \cdot K_{DAC}$, $b_2 \cdot K_{DAC}$, and $b_3 \cdot K_{DAC}$, respectively) for an entire clock period $T_s$, and that they are otherwise zero; see FIG. 14. Also for simplicity—and only for simplicity—it will be assumed that the delays, $T_{d1}$, $T_{d2}$, and $T_{d3}$, are integer multiples of the clock period $T_s$. These choices correspond to systems which are particularly simple to implement, but many alternative systems can indeed be implemented equally well.

Open-Loop Response.

The design of continuous-time delta-sigma modulators is, in principle, identical to the design of discrete-time delta-sigma modulators. Those who are skilled in the art know exactly which open-loop frequency response $H(z)$ (or noise transfer function $1/(1+H(z))$) they want their delta-sigma modulator to have. Any z-domain transfer function $H(z)$ is defined with respect to discrete-time systems, which is exactly what a continuous-time delta-sigma modulator [158] is when it is evaluated from the digital feedback signal $d_f(k)$ to the digital output signal $d(k)$.

Hence, designing a continuous-time delta-sigma modulator [158] is a matter of choosing the loop filter's [178] topology and the analog feedback signal's delays ($T_{d0}$, $T_{d1}$, $T_{d2}$, and $T_{d3}$), gain coefficients ($b_0$, $b_1$, $b_2$, $b_3$), and waveforms, such that the transfer function (here, $Z\{\cdot\}$ denotes the Z transform)

$$H(z) = \frac{Z\{-v(k \cdot T_s)/K_{DAC}\}}{Z\{d_f(k)\}} \qquad (3)$$

is the desired rational function in $z$. The many degrees of freedom imply that the continuous-time system can be designed in multiple ways yielding the same discrete-time description $H(z)$. To simplify the discussion, the delays and the waveforms will be restricted as discussed above. Only the feedback signal's gain coefficients, $b_0$, $b_1$, $b_2$, and $b_3$, and the loop filter's [178] topology will be considered parameters open for the design process.

To simplify the discussion without loss of generality, it will be assumed that the three integrators', [172], [174], and

[176], time constants are all $T_s$, and that the sampling period $T_s$ is one second. The resulting system can easily be scaled afterwards to correspond to the actual sampling period and integrator time constants.

The transfer function's $H(z)=B(z)/A(z)$ denominator $A(z)$ is known in advance. For an nth-order system (here, n is 3), the denominator is $A(z)=(1-z^{-1})^n$. Those who are skilled in the art of designing delta-sigma modulators know that the denominator $A(z)$ can be modified by incorporating local feedback paths in the loop filter's [178] topology, e.g., a signal path from the output of the third integrator [176] to the input of the second integrator [174] (not shown). This technique is not used in the considered example, although it can be used very successfully.

For a well-designed nth-order delta-sigma modulator, the numerator $B(z)$ of $H(z)$ is generally an nth-order polynomial in $z^{-1}$, for which the constant term is zero, i.e., $$B(z) = q_1 \cdot z^{-1} + q_2 \cdot z^{-2} + q_{n-1} \cdot z^{-(n-1)} + \ldots q_n \cdot z^{-n}. \tag{4}$$

A third-order multi-bit delta-sigma modulator can be designed using, e.g., $$B(z) = 2.361 \cdot z^{-1} - 2.696 \cdot z^{-2} + 0.9433 \cdot z^{-3}. \tag{5}$$

Choosing the Loop Filter's Topology.

The best way to obtain a good understanding of how the loop filter's [178] topology should be designed is probably by starting with a low-order system and then gradually increasing the order. Thus, consider initially a first-order open-loop delta-sigma modulator [180], see FIG. 15.

If a negative digital impulse signal is applied as the digital feedback signal (i.e., $d_f(0) = -1$), the open-loop transfer function $H(z)$ can be calculated as the Z-transformed of $v(k \cdot T_s)/K_{DAC}$. The superposition principle can be used to simplify the calculations.

Thus, first calculate $H(z)$ for the modulator [180] when $b_0$ is the only nonzero gain coefficient. This partial transfer function will be called $H_{b0}(z)$. Given the above assumptions, i.e., that $0 < T_{d0} < T_s$, it follows immediately that $$H_{b0}(z) = b_0 \cdot z^{-1}. \tag{6}$$

Then calculate $H(z)$ for the modulator [180] when $b_1$ is the only nonzero gain coefficient and the delay $T_{d1}$ is zero. This partial transfer function will be called $H_{b1,0}(z)$. The result $H_{b1,0}(z)$ can be obtained directly from Tables found in several textbooks. Alternatively, MATLAB or a similar software package can be used to calculate $H_{b1,0}(z)$ effortlessly. Either way, the result is $$H_{b1,0}(z) = b_1 \cdot \frac{z^{-1}}{1-z^{-1}}. \tag{7}$$

When the delay $T_{d1}$ is $n_1$ clock cycles, the transfer function will be called $H_{b1,n_1}(z)$, $$H_{b1,n_1}(z) = b_1 \cdot \frac{z^{-(n_1+1)}}{1-z^{-1}}. \tag{8}$$

According to the superposition principle, the effective (combined) open-loop transfer function $H(z)$ can be calculated as the sum of $H_{b0}(z)$ and $H_{b1,n_1}(z)$, $$H(z) = \frac{b_0 \cdot (z^{-1} - z^{-2}) + b_1 \cdot z^{-(n_1+1)}}{1-z^{-1}}. \tag{9}$$

Clearly, for $b_0 = b_1$ and $T_{d1} = T_s$, the transfer function becomes $H(z) = z^{-1}/(1-z^{-1})$, which corresponds to the classic first-order delta-sigma modulator.

Next, consider a second-order continuous-time delta-sigma modulator [182], see FIG. 16. The superposition principle can be used again. $H_{b0}(z)$ and $H_{b1,n_1}(z)$ are already calculated, thus it is necessary to calculate only $H_{b2,0}(z)$, i.e., the transfer function for $b_0 = b_1 = 0$ and zero delay $T_{d2} = 0$. The transfer function can be calculated to be $$H_{b2,0}(z) = \frac{b_2}{2} \cdot \frac{z^{-1} + z^{-2}}{(1-z^{-1})^2}. \tag{10}$$

If $a_2(t)$ is delayed $n_2$ clock cycles, i.e., $T_{d2} = n_2 \cdot T_s$, the combined transfer function $H(z)$ can be calculated to be (again, using the superposition principle)

$$H(z) = \frac{b_0 \cdot (z^{-1} - 2z^{-2} + z^{-3}) + b_1 \cdot (1-z^{-1}) \cdot z^{-(n_1+1)} + 0.5 \cdot b_2 \cdot (1+z^{-1}) \cdot z^{-(n_2+1)}}{(1-z^{-1})^2}. \tag{11}$$

Notice that if either $n_1$ or $n_2$ is 2 or higher, the numerator will generally comprise powers of $z^{-1}$ higher than the modulator's [182] order, two, which is undesired. To avoid this scenario, the loop filter's topology can be modified as shown in FIG. 17.

In the open-loop delta-sigma modulator [184] shown in FIG. 17, a feedforward path [186] adds a portion $l_2$ of the second integrator's [174] output signal to the first integrator's [176] output signal at node [170] (an alternative technique would be to generate a zero in the first integrator's [176] transfer function). Because the topology [184] is revised, the transfer function for $b_2$ needs to recalculated. To simplify the following equations, it is now assumed that $T_{d1} = T_s$ and $T_{d2} = 2 \cdot T_s$. The transfer function can be calculated to be $$H_{b2,2}(z) = b_2 \cdot \frac{z^{-3} \cdot (0.5 + l_2) + z^{-4} \cdot (0.5 - l_2)}{(1-z^{-1})^2}. \tag{12}$$

Thus, the combined transfer function is $$H(z) = \frac{z^{-1} \cdot (b_0) + z^{-2} \cdot (-2b_0 + b_1) + z^{-3} \cdot (b_0 - b_1 + b_2(0.5 + l_2)) + z^{-4} \cdot (b_2(0.5 - l_2))}{(1-z^{-1})^2}. \tag{13}$$

Obviously, it is now a simple matter to choose the coefficients, $b_0$, $b_1$, $b_2$, and $l_2$, such that the numerator is any polynomial in $z^{-1}$ of fourth order or less. Generally, one would choose $l_2 = 0.5$ and $b_2 = b_1 - b_0$, whereby the transfer function becomes very simple $$H(z) = \frac{z^{-1} \cdot (b_0) + z^{-2} \cdot (-2b_0 + b_1)}{(1-z^{-1})^2}. \tag{14}$$

Finally, consider the third-order open-loop delta-sigma modulator [188] shown in FIG. 18. The delays are as shown in FIG. 14, i.e., the modulator [188] is a generalization of the modulator [184] discussed above, for which $T_{d3}=3 \cdot T_s$. The partial transfer function calculated with respect to $b_3$ is $$H_{b3,3} = \frac{b_3 \cdot z^{-3} \cdot ((z^{-1} + 4z^{-2} + z^{-3}) + 3 \cdot l_2 \cdot (z^{-1} - z^{-3}) + 6 \cdot l_3 \cdot (z^{-1} - 2 \cdot z^{-2} + z^{-3}))}{6 \cdot (1-z^{-1})^3}. \quad (15)$$

The feedforward path [190] is included to facilitate cancellation of the high-order terms, i.e., terms comprising $z^{-4}$, $z^{-5}$, and $z^{-6}$. The numerator B(z) of the overall open-loop transfer function $$H(z) = \frac{B(z)}{(1-z^{-1})^3} \quad (16)$$

is shown in FIG. 19. It is generally possible to obtain the desired transfer function by choosing the six coefficients, $b_0$, $b_1$, $b_2$, $b_3$, $l_2$, and $l_3$, properly. However, some uncertainty of the electrical parameters representing the coefficients in analog circuits is unavoidable. Hence, it is preferable to make the transfer function H(z) as insensitive to coefficient mismatch as possible. The introduction of yet another feedforward path [194] in the open-loop delta-sigma modulator [192], as shown in FIG. 20, has an advantage in this regard which will become apparent momentarily. The transfer function's H(z) numerator B(z) now attains the expression shown in FIG. 21. Observe that if $l_2=l_4=½$ and $l_3=⅓$, then B(z) will be an only fourth-order polynomial for all values of the feedback coefficients, $b_0$, $b_1$, $b_2$, and $b_3$. By further choosing $b_3=b_0+b_2-b_1$, B(z) will become a third-order polynomial in $z^{-1}$, which can be chosen arbitrarily by choosing the coefficients, $b_0$, $b_1$, and $b_2$, correctly. Thus, for the specific design discussed above, B(z)=2.361·$z^{-1}$−2.696·$z^{-2}$+0.9433·$z^{-3}$, one would choose $b_0$=2.361, $b_1$=4.387, $b_2$=2.634, and $b_3$=0.6083.

5.3.2 Designing the Filter's Feedforward Signal Path

FIG. 22 shows the overall continuous-time delta-sigma modulator system [196]. The proper design of the loop filter [198] and the feedback DACs [162] was discussed above. The input signal g(t) is quantized by a coarse quantizer [202], which principally can be of almost any type: flash quantizer two-step quantizer, pipelined quantizer, delta-sigma quantizer, etc. For simplicity, assume that the coarse quantizer [202] is a 5-bit flash quantizer strobed a short period $T_d$ before the loop quantizer [160] is strobed at times $t=k \cdot T_s$.

The coarse quantizer [202] provides a coarse digital representation $d_0(k)$ of $g(k \cdot T_s - T_d)$. Ideally, the modulator [196] will be designed such that the coarse quantizer [202] and the loop quantizer [160], in combination, effectively will perform a two-step relatively high-resolution quantization d(k) of the input signal g(t) plus a small signal v(t) compensating for the signal-band errors in d(k). To refresh this fundamental principle, the reader should compare the continuous-time modulator [196] with the discrete-time modulator [82] shown in FIG. 6. Thus, the analog signal y(t) quantized by the loop quantizer [160] should comprise the negative of $d_0(k) \cdot K_{DAC}$. This is obtained using the coarse DAC [204] adding −p(t) to the node [170] at the loop quantizer's [160] input. Clearly, p(t) must fulfill only that $p(k \cdot T_s)=d_0(k) \cdot K_{DAC}$, i.e., the waveform of p(t) is largely unimportant. The corresponding signal y(t) is quantized by the loop quantizer [160] and the result $d_1(k)$ is added to $d_0(k)$ thereby generating the digital output d(k). A delay block [206] may be used to align the two digital words time wise.

A very important design issue is, of course, how the filter's input signal paths [200] should be designed. Phrased differently, how should the analog signals, $h_3(t)$, $h_2(t)$, $h_1(t)$, and $h_0(t)$, respectively injected at nodes [164], [166], [168], and [170], be generated? There is a very simple and accurate answer to this question. The filter's input signal paths [200] should be designed such that the the closed-loop system's [196] transfer function from g(t) to y(t) is zero in the signal band; preferably in a wider frequency range.

Specification of the Desired Frequency Response.

There are, in principle, three signal paths from g(t) to y(t). The first signal path travels through the filter's input signal paths [200], the second travels through the coarse DAC [204], and the third travels through the feedback DACs [162]. Thus, the filter's input signal paths [200] must be designed such as to cancel the second [204] and the third [162] signal paths. The calculations can be simplified by considering the situation where the loop quantizer [160] has been removed from the circuit [196]. The validity of this technique can be verified using Mason's law from graph theory.

First, characterize the second signal path from g(t) to $y(k \cdot T_s)$, i.e., from g(t) to $-p(k \cdot T_s)$. The input signal g(t) is a continuous-time signal, whereas the output signal $p(k \cdot T_s)$ is defined as a discrete-time signal. However, this difference does not constitute a problem when both signals are evaluated in the frequency domain. Thus, the objective is to find the complex frequency response $H_{II}(f)$. If the coarse quantizer [202] is a flash quantizer, the frequency response will generally be characterized by the delay only, i.e., $$H_{II}(f) = -e^{-j2\pi f T_d}. \quad (17)$$

However, if the coarse quantizer [202] is (say) a delta-sigma quantizer, the frequency response from g(t) to $d_0(k)$ may depend on the frequency, thus $H_{II}(f)$ can be expressed more generally as $$H_{II}(f) = -H_{ADC}(f) \cdot e^{-j2\pi f T_d}. \quad (18)$$

where $H_{ADC}(f)$ is the coarse quantizer's [202] normalized frequency response. Ideally, $H_{ADC}(f)$ is unity for all data quantizers (i.e., flash, folding, interpolating, pipeline, successive approximation, etc.), but not necessarily for signal quantizers (i.e., delta-sigma).

Next, characterize the third signal path from g(t) to $y(k \cdot T_s)$, i.e., through the feedback DACs [162]. The frequency response $H_{dy}(f)$ from d(k) to $y(k \cdot T_s)$ is well known $$H_{dy}(f) = -K_{DAC} \cdot H(z), \text{ where } z = e^{j2\pi f T_s} \quad (19)$$

where H(z) is the delta-sigma modulator's [196] open-loop gain, i.e., for the numerical example considered above $$H(z) = \frac{2.361 \cdot z^{-1} - 2.696 \cdot z^{-2} + 0.9433 \cdot z^{-3}}{(1-z^{-1})^3}. \quad (20)$$

Thus, the third signal path can be described as $$H_{III}(F) = -H_{ADC}(f) \cdot e^{j2\pi f T_d} \cdot H(z), \text{ where } z = e^{j2\pi f T_s}. \quad (21)$$

Finally, it can be concluded that the first signal path, i.e., the signal path from g(t) to $y(k \cdot T_s)$ through the filter's input signal paths [200], ideally should have the frequency response $$H_{I,ideal}(f) = -(H_{II}(f) + H_{III}(f)) \quad (22)$$

$$= H_{ADC}(f) \cdot e^{-j2\pi f T_d} \cdot (1 + H(z)), \text{ where } z = e^{j2\pi f T_s}.$$

Notice that this result, $H_{I,ideal}(f)$, is consistent with the above discussion of the discrete-time modulator [82] represented by the signal-flow model [110] shown in FIG. 8. Here, $H_{ADC}(f)=1$ and $T_d=T_s$, i.e., $e^{-j2\pi fT_d}=z^{-1}$, and thus the ideal result is obtained $H_f(f)=z^{-1}\cdot(1+H(z))$. The first term, $z^{-1}$, in $H_f(f)$ is the pipeline quantizer's [84M] delaying input path from g(k), whereas the second term, $z^{-1}\cdot H(z)$, is implemented by the analog delay line [88M] and the properly designed input signal paths [114].

Preferred Implementation.

In the preferred implementation, minimum analog signal processing is performed to generate the filter's two input signals most sensitive to errors, $h_3(t)$ and $h_2(t)$. Thus, these signals are restricted to be simple scaled versions of g(t), i.e., $h_3(t)=e_3\cdot g(t)$ and $h_2(t)=e_2\cdot g(t)$.

Errors comprised in the filter's two other input signals, $h_1(t)$ and $h_0(t)$, are less deleterious for the overall performance, and thus some analog signal processing may be performed to generate them, if necessary. Thus, in the general case, a continuous-time linear system [208] is used to generate $h_1(t)$ and $h_0(t)$. Considering that the loop filter [198] itself is a continuous-time linear system, it can be concluded that the frequency response $H_f(f)$ can be expressed as a Laplace transformed $H_f(f)$–$H_{gy}(s)$, where, $s=j2\pi f$.

Assume again that the coarse quantizer [202] is a flash quantizer, i.e., that $H_{ADC}(f)=1$. Clearly, it is not possible to match a finite-order s-domain transfer function, $H_{gy}(s)$, $s=j2\pi f$, to $H_{I,ideal}(f)=e^{-j2\pi fT_d}\cdot(1+H(z))$, $z=e^{j2\pi fT_s}$ at all frequencies f. Fortunately, the frequency responses $H_f(f)$ and $H_{I,ideal}(f)$ need match only at frequencies f where g(t) have significant spectral components, or at least in the system's signal band. If, for example, $$T_d < T_s \cdot \frac{OSR}{5} \quad (23)$$

where OSR is the modulator's [196] oversampling ratio, and that is generally the case, the delay term $e^{j2\pi fT_d}$ can be implemented very well by a simple first-order all-pass filter $$H_{delay}(s) = \frac{2-s\cdot T_d}{2+s\cdot T_d}. \quad (24)$$

A bilinear transformation (sometimes also called the "q transformation") can be used to generate a nth-order s-domain transfer function $H_{loop}(s)$ which match the nth order z-domain transfer function $(1+H(z))$ relatively well at low frequencies f, i.e., in the signal band for baseband modulators [196], $$H_{loop}(s) = (1+H(z)), \text{ where } z = \frac{2+s\cdot T_s}{2-s\cdot T_s}. \quad (25)$$

Thus, for baseband modulators [196], the filter's input signal paths [200] can be designed according to $$H_{gy}(s) = \frac{2-s\cdot T_d}{2+s\cdot T_d}\left(1+H\left(\frac{2+s\cdot T_s}{2-s\cdot T_s}\right)\right). \quad (26)$$

For wide-band applications it is generally recommendable to increase $T_s$ and $T_d$ by a few percent when used for this calculation (a technique called "prewarping").

Using the bilinear transformation, the order of $H_{gy}(s)$ is generally one higher than the order of H(z), unless $T_d=0$, in which case the orders are the same. This can be implemented quite easily by generating $h_1(t)$ as a scaled version of g(t), i.e., $h_1(t)=e_1\cdot g(t)$, and using a simple filter (not shown) with the transfer function $$H_{h0}(s) = e_0 + e_{00}\cdot\frac{2-s\cdot T_d}{2+s\cdot T_d} \quad (27)$$

to generate $h_0(t)$.

A more general technique for the calculation of $H_{gy}(s)$ is to use a software package like MATLAB (e.g., using a function called "invfreqs") to find a pth-order transfer function $H_{gy}(s)$ which approximates $H_{I,ideal}(f)$ with the required accuracy in the desired frequency range. The higher the order p of $H_{gy}(s)$ the better the frequency responses can be made to match in a wide frequency range. If the modulator's [196] oversampling ratio OSR is at least (say) 10, a good correspondence $H_{I,ideal}(f)\cong H_{gy}(j2\pi f)$, $2\cdot OSR\cdot T_s\cdot f<1$ can be obtained by generating all the filter's input signals, $h_3(t)=e_3\cdot g(t)$, $h_2(t)=e_2\cdot g(t)$, $h_1(t)=e_1\cdot g(t)$, and $h_0(t)=e_0\cdot g(t)$, as simple scaled versions of the input signal g(t).

5.3.3 The Output Signal's Resolution

Similar to the above discussion of discrete-time delta-sigma modulators, the loop quantizer's [160] resolving range must be somewhat larger than the coarse quantizer's [202] step size. Ideally, the magnitude of the loop quantizer's [160] input signal y(t) will be less than (say) twice the coarse quantizer's [202] input-referred step size, 1 LSB. This is easily achieved for discrete-time modulators (discussed above), but for continuous-time modulators [196] spectral aliasing and input signal leakage may increase the magnitude of y(t).

The signal p(t) provided by the coarse DAC [204] will comprise three spectral components. The desired component is g(t) modified by the coarse quantizer's [202] frequency response $H_{ADC}(f)$. Obviously, p(t) will comprise also the quantization error caused by the coarse quantizer's [202] finite resolution. The quantization error's magnitude is proportional to the coarse quantizer's [202] step size, which principally can be reduced to any level. A third error, however, may be caused by spectral aliasing, i.e., because g(t) and $g(k\cdot T_s-T_d)$ may not have exactly the same spectral composition, not even in the signal band. Such errors are independent of the coarse quantizer's [202] resolution. Thus, the worst-case magnitude of y(t) will more often than not be a fraction of the input signal's g(t) maximum magnitude, rather than proportional to the coarse quantizer's [202] step size. Similarly, mismatch of $H_f(f)$ and $H_{I,ideal}(f)$ will cause leakage from g(t) to y(t) and may cause the magnitude of y(t) to depend on the input signal's magnitude and spectral composition.

If the input signal g(t) comprises only negligible spectral components outside the signal band, the magnitude of y(t) can indeed be made quite small. It may, therefore, be worthwhile to precede the delta-sigma modulator [196] with a filter (not shown) suppressing spectral components not in the signal band.

Typically, the resolution of d(k) can be made only 3–5 bits higher than the loop quantizer's [160] resolution. Thus, the best design strategy is generally to use a loop quantizer [160] with the highest reasonable resolution, say 6 bits. The advantage (3–5 bits of "extra" resolution) obtained by employing the coarse quantizer [202] may not sound very impressive when expressed in bits of resolution. However, in terms of circuit complexity, the advantage is substantial. A 3+6=9 bit delta-sigma modulator [196] will require approximately 100 latches (not shown) to implement the two quantizers [202] and [160], whereas a traditional 0+9=9 bit delta-sigma modulator will require 512 latches to implement the loop quantizer [160]. Considering also that the 3+6=9 bit delta-sigma modulator [196] can be implemented using latches with much larger offset errors than those needed to implement the 0+9=9 bit delta-sigma modulator, the advantage in terms of power consumption and the chip area required to implement the two circuits is much in favor of the proposed 3+6=9 bit delta-sigma modulator [196]. Notice that spectral aliasing errors can be reduced significantly by implementing the coarse quantizer [202] as a delta-sigma quantizer, which need not be a high-performance one. In that case, the coarse DAC [204] may be omitted, and the delay Td be zero. However, there are certain advantages of implementing the coarse DAC [204], even if the coarse quantizer [202] is a delta-sigma quantizer.

5.3.4 Implementation Example

FIG. 23 shows how the 3+6=9 bit continuous-time delta-sigma modulator [196] can be implemented. The loop filter [198] is based on four fully-differential operational amplifiers; three coupled as integrators, [218], [220], and [222], and one coupled as a summation circuit [224]. The filter's [198] frequency response is relatively robust to process variations because it depends only on the common time constant R·C. This time constant must have a fixed relationship to the sampling period $T_s$, and it may be necessary to use, e.g., a master-slave tuning circuit to adjust R·C to the desired value (standard technique used for the design of continuous-time filters; tuning circuit not shown). The simplest is to adjust the capacitors C only. The filter [198] shown is not scaled to optimize the noise performance; this well-known technique should, of course, be used.

The filter's [198] input signal paths [200] are implemented as resistors scaled according to the common resistive value R and the coefficients $e_3$, $e_2$, $e_1$, and $e_0$. The feedback DACs [162] are current-mode DACs with gains defined with respect to $K_{DAC}/R$ and the feedback coefficients, $b_3$, $b_2$, $b_1$, and $b_0$. $K_{DAC}$ is defined as a voltage, say 2.048 Volt. The loop quantizer [160] is a 6-bit flash quantizer with step size 1. The coarse quantizer can be a 5-bit flash quantizer with step size 16, or a 6-bit quantizer with step size 8 (i.e., having the same resolving range). The nonoverlapping clock signals, $\Phi_1$ and $\Phi_2$, are the same as shown in FIG. 7.

The feedback DACs [162] are implemented with an increasing delay and performance the closer they are to the input node [164]. Mismatch-shaping is a good technique to suppress errors caused by static mismatch of the current sources used to implement the DACs [162] (the current sources are not shown specifically). U.S. patents describing spectral encoders implementing several good mismatch-shaping algorithms have been cited above. It is, however, also necessary to be concerned about dynamic errors. It is, therefore, preferable to employ the deglitching stage discussed in U.S. Pat. No. 4,639,619, to Gary Baldwin et al., or a similar technique to prevent dynamic errors. Any efficient technique suitable for enhancing the performance of current-mode DACS, which does not require more time than the alloted delay, should be considered for use in the feedback DACs [162]. Here, the most critical DAC [210] employs a second-order mismatch-shaping algorithm and a deglitching stage; 3 clock cycles of (pipeline) delay are available to achieve this operation. The second-most critical DAC [212] employs a first-order mismatch-shaping algorithm and a deglitching stage; 2 clock cycles of (pipeline) delay are available to achieve this operation. The third-most critical DAC [214] may cause only one clock cycle of delay, which is used for a first-order mismatch-shaping algorithm. The least critical DAC [216] is just a simple DAC not employing any particular tricks. However, this DAC [216] need only be about 10-bit linear.

5.4 Description of a Fourth Preferred Embodiment

FIG. 24 shows the overall topology of a continuous-time delta-sigma modulator [226], which is an important fourth embodiment. It is a generalization of the the discrete-time modulator [46] shown in FIG. 3 and discussed above; the considered modulator [226] has several important advantages.

The coarse quantizer is a 5-bit delta-sigma modulator [228]. Thus, the first digital estimate $d_0(k)$ is a relatively good signal-band representation of g(t) comprising very little distortion (depending on the feedback DAC's [230] linearity). The overall modulator's [226] linearity will generally not be limited by the linearity of the coarse quantizer's feedback DAC [230], thus it may be a relatively simple one.

The primary feedback DAC [232] is used to calculate the residue $r_0(t)$ of $d_0(k)$, which is the main delta-sigma modulator's [234] input signal. The residue $r_0(t)$ may also be added to v(t) at the loop quantizer's [236] input (see FIG. 5), but it is not necessary to do so because $r_0(t)$ will comprise only little distortion of g(t). The main modulator's [234] output signal $d_1(k)$ is added to the first digital estimate $d_0(k)$ to generate the overall digital output signal d(k). Ideally, $r_0(t)$ and $d_1(k)$ should be small in magnitude, and the physical resolution of d(k) be significantly higher than the loop quantizer's [236] resolution. In practice, the residue signal's $r_0(t)$ worst-case magnitude may be (say) 20 dB less than the input signal's g(t) magnitude.

Notice that the primary feedback DAC [232] in combination with the secondary feedback DAC [238] subtract the analog equivalent of d(k) from the input signal g(t), i.e., e(t) is the residue of g(t) with respect to d(k). In other words, the feedback DAC [54] in FIG. 3 has in FIG. 24 been split into two feedback DACs, [232] and [238]. Several advantages are be obtained by this separation, one of which is the feedback DACs' relatively lower resolution (5 bits and 6 bits, respectively).

As always, the modulator's [226] linearity is critically dependent on the global feedback DAC's linearity, i.e., the linearity of [232] and [238]. Hence, the primary feedback DAC [232] should be implemented according to the state of the art; it should generally be based on an effective mismatch-shaping algorithm and comprise circuitry to suppress dynamic errors. The low resolution (5 bits) facilitates use of almost any mismatch-shaping algorithm, including those based on controlling arrays of nominally identical analog elements (unit-element mismatch-shaping algorithms). The modulator [226] is designed such that the digital compensation signal $d_1(k)$ is at least 8 times smaller in magnitude than the first digital signal $d_0(k)$, thus the secondary feedback DAC [238] need not be as good as the primary feedback DAC [232]. However, generally it [238] should be at least first-order mismatch-shaping.

Matching the gains of the feedback DACs, here [232] and [238], is normally of crucial importance for two-step quantizers, but it is of only little concern for this type of modulator [226] because $r_0(t)$ comprises only little power in the signal band. The theoretical explanation for this inherent robustness is provided in U.S. Pat. No. 5,982,317 to Steensgaard.

The coarse delta-sigma quantizer [228] is relatively straight-forward to implement, but great care must be taken at the system level not to overload the loop quantizer [236]. This aspect will be discussed below. However, the design of the coarse delta-sigma quantizer [228] will be addressed first.

5.4.1 High-Speed Second-Order Delta-Sigma Modulator

Those who are skilled in the art know how to design the coarse delta-sigma quantizer [228], but the design is not straight-forward when the sampling frequency is very high.

Consider the situation where the sampling frequency is increased to a level where flash quantizers' latency is comparable to the sampling period $T_s$. Because delta-sigma modulators' minimum-delay loop may comprise only one clock cycle of delay, it may be concluded that the loop quantizer's finite speed eventually will become a limiting factor in the design of very-high-speed delta-sigma modulators. The following discussion will illustrate how the multi-path mixed-delay feedback technique can be used to facilitate operation at very high sampling frequencies where standard design techniques cannot be used.

FIG. 25 shows how the coarse delta-sigma quantizer [228] is implemented. It is based on a second-order loop filter [250] of the type discussed above (the open-loop structure [184] was shown in FIG. 17). The two integrators [174] and [176] are implemented on the basis of opamps [252] and [254], and the summation at node [170] is implemented on the basis of a third opamp [256].

The loop quantizer [258] samples the signal y(t) at times $t = k \cdot T_s$. The minimum-delay feedback signal $a_0(t)$ must be updated shortly after the sampling instances.

Instead of producing all the feedback signals by D/A converting the digital output signal $d_0(k)$, an analog feedback circuit [260] samples y(t) simultaneously with the loop quantizer [258] and provides almost instantly the feedback signal $a_0(t) = y(k \cdot T_s) \cdot b_0$ to the summation circuit [256]. The analog feedback circuit [260] also provides the second analog feedback signal $a_1(t)$. This feedback signal should be be delayed by one clock cycle such that the global feedback signal $a_2(t)$ can be delayed two clock cycles with respect to when the loop quantizer [258] samples the signal. The analog feedback circuit [260] charges a capacitor [262] to $y(k \cdot T_s)$ one clock cycle after the signal y(t) is sampled. Because the portion of the loop filter [250] following the first integrator [254] is time-invariant, it is only the amount of charge provided by $a_1(t)$ that matters, not the waveform. The charge provided by $a_1(t)$ during one clock cycle depends on the charge stored on the capacitor [262], the time constant of the resistive coupling [264], and the duration of the period the capacitor [262] is connected to the integrator [254]. The resistors [264] are used to prevent slew-rate distortion in the integrator [254]. In this implementation the capacitor [262] is connected to the integrator [254] in one half clock cycle. Thus, if the RC time constant of [262] and [264] is $T_s/2$, approximately 63.2% of the charge stored on the capacitor [262] will be transfered to the integrator [254].

Clearly, the loop quantizer's [258] latency may now be as much as one clock cycle, or even more if several loop quantizers are used time interleaved (not shown). The analog feedback circuit [260] can operate at very high clock frequencies, say 500 MHz, if it is implemented using open-loop circuitry. The voltage buffers [266] can, e.g., be implemented as source/emitter followers. Open-loop circuits do usually not provide very linear performance (it is hard to achieve more than 8–10 bits of linearity), but the point is once again that the modulator [228] is relatively robust to errors in the local analog feedback signals $a_0(t)$ and $a_1(t)$. For critical higher-order modulators it is best to generate only a few of the feedback signals using analog feedback circuits; feedback DACs can generally be made more linear than open-loop analog-signal-processing circuits (i.e., if they are allowed sufficient latency). For this particular modulator [228], the performance is somewhat secondary because distortion will be suppressed by the main modulator [234] (see FIG. 24).

The loop filter's input signal paths [268] may be designed as discussed above, i.e., such that $y(t) \cong g(t)$. This is achieved by choosing the coefficients, $e_0$, $e_1$, and $e_2$, such that in an extended signal band $$\frac{e_2 + s \cdot e_1 + s^2 \cdot e_0}{s^2} \simeq 1 + H(z), \text{ where } z = e^{-sT_s} \tag{28}$$

where H(z) is the modulator's [228] discrete-time loop gain. To achieve better matching in a wide frequency range, $e_0$ may be substituted by a (say, first-order) transfer function, and the circuit modified accordingly (this technique is exemplified in FIG. 26, to be discussed).

5.4.2 The Main Delta-Sigma Modulator

FIG. 26 shows the main delta-sigma modulator [234]. It comprises a third-order loop filter [270] of the same type [198] as shown in FIG. 23 and discussed above. The feedback delays, $T_{d3}$, $T_{d2}$, $T_{d1}$, $T_{d0}$, and the feedback coefficients, $b_3$, $b_2$, $b_1$, $b_0$, are the same as used for the third embodiment [196] discussed above.

The two least critical feedback signals are generated using an analog feedback circuit [272] similar to that [260] used for the coarse delta-sigma quantizer [228]. Clearly, the feedback coefficients, $b_3$, $b_2$, $b_1$, $b_0$, are not the same as those used for the coarse delta-sigma quantizer [228]; the loop filters are of different orders.

The two most critical feedback signals are generated by D/A converting the digital compensation signal $d_1(k)$. The most critical DAC [274] makes use of a first-order mismatch-shaping algorithm and a deglitching output stage, whereas the second-most critical DAC [276] uses only a deglitching output stage (less time is available).

Designing the Filter's Input Signal Paths

The input signal g(t) is applied through the loop filter's input paths [278]. However, the first digital estimate $d_0(k)$ represents the input signal g(t), and thus g(t) is applied also through the primary feedback DAC [232]. The primary feedback DAC [232] must provide a very linear D/A conversion. It makes use of a second-order mismatch-shaping algorithm and a deglitching output stage, and the generated signal is delayed by four clock cycles with respect to g(t).

The loop quantizer's [236] resolving range is relatively small, one eighth of full scale, and it must not be overloaded. To prevent overloading, the gain from g(t) to $d_1(k)$ must be relatively small, say less than one tenth of $1/K_{DAC}$. The calculations can be simplified by instead calculating the transfer function from g(t) to the residue signal $r_0(t)$ at the input node [280].

The frequency response from g(t) to the primary feedback DAC's [232] output signal is $$H_{dr}(f) = -H_{ADC}(f) \cdot e^{-j2\pi f 4 T_s} \cdot H_{DAC}(f), \tag{29}$$

where $H_{ADC}(f)$ is the coarse quantizer's [228] normalized frequency response and $H_{DAC}(F)$ is the primary feedback DAC's [232] normalized frequency response. Assume initially that the coarse quantizer [228] is designed such that $H_{ADC}(f) \cong 1$ in the extended signal band. The feedback DAC's [232] normalized frequency response $H_{DAC}(f)$ cannot be unity. Assuming that the primary feedback DAC

[232] is designed to have a zero-order holding impulse response, the normalized frequency response is $$H_{DAC}(f) = \frac{1 - e^{-j2\pi fT_s}}{j2\pi f}. \quad (30)$$

The objective is to design the loop filter's input signal paths [278] to have a frequency response $H_{gr}(f)$ approximately equal to the ideal response (i.e., in the extended signal band)

$$H_{gr,ideal}(f) = H_{ADC}(F) \cdot e^{-j2\pi f 4 T_s} \cdot H_{DAC}(f). \quad (31)$$

Assuming that $T_s/2\pi = R \cdot C = 1$ second, the frequency response $H_{gr}(f)$ can be calculated to be $$H_{gr}(f) = e_3 + e_2 \cdot s + e_1 \cdot s^2 + e_0 \cdot s^3 + e_{00} \cdot s^4, \text{ where } s = j2\pi f. \quad (32)$$

MATLAB can be used to find the coefficients, $e_3$, $e_2$, $e_1$, $e_0$, $e_{00}$, such that $H_{gr}(f)$ match $H_{gr,ideal}(f)$ reasonably well in the extended signal band. For example, using the coefficients $e_{00} = 0.00488$ $e_0 = -0.0364$ $e_1 = 0.209$ $e_2 = -0.626$ $e_3 = 0.947$ the gain of $(H_{gr}(f) - H_{gr,ideal}(f))$ will be less than −20 dB for frequencies f up to $1/(12 \cdot T_s)$; i.e., in the signal band of a 6 times oversampled system. That is sufficiently good for the present purpose.

Clearly, $(H_{gr}(f) - H_{gr,ideal}(f))$ can be made smaller in the same wide frequency range if $H_{gr}(f)$ is an FIR filter of order higher than 4. However, it is also possible to improve the matching of $H_{gr}(f)$ and $H_{gr,ideal}(f)$ by adjusting the coarse quantizer's [228] frequency response $H_{ADC}(f)$. By choosing the filter's input signal paths [268] properly, it is possible to compensate for some of the delay, i.e., $H_{ADC}(f) \approx e^{j2\pi fT_s}$, $f \cdot T_s < 1/12$, whereby the matching can be improved or the frequency range extended.

Improved Stability/Performance Using Nonuniform Quantizers

The loop quantizer [236] may potentially be overloaded when the input signal g(t) has large spectral components outside the extended signal band. Overloading is not likely to happen for small input signals g(t).

The dynamic-range performance is generally more important than the peak-signal-to-noise ratio performance. A nonuniform loop quantizer [236] can be used to improve the dynamic-range performance, see FIG. 27. The loop quantizer's [236] step size should be small in the midrange, such that the quantization-noise performance is good for small input signals g(t). The step size is increased near the boundaries of the resolving range, such that the modulator [234] will remain stable if large input signals should leak through to the loop quantizer [236]. For graphical simplicity, the resolution shown in FIG. [27] is lower than the loop quantizer's [236] actual resolution. Using this technique, the loop quantizer [236] can be simplified greatly without deteriorating the overall performance noticeably, and/or the modulator's [234] stability can be enhanced.

A moments consideration will lead to the conclusion that the modulator's [226] performance/complexity properties can be optimized further by designing the coarse quantizer's [228] loop quantizer [258] to have a nonuniform transfer characteristic.

6 CONCLUSION, RAMIFICATION, AND SCOPE OF INVENTION

Accordingly, the reader will see that delta-sigma modulators designed according to this invention have several significant advantages facilitating the implementation of improved high-resolution wide-bandwidth A/D converters.

A first aspect of this invention is the use of multistep quantization techniques to increase the delta-sigma modulator's internal resolution, i.e., without reducing the sampling frequency. Multistep quantizers are generally associated with latency. Thus, if multistep quantizers are used directly as the loop quantizer in delta-sigma modulators, the maximum sampling frequency would normally be reduced significantly. A fundamental principle of this invention is to use a separate first quantizer to generate a first digital estimate of the input signal, and to design the delta-sigma loop such that the loop quantizer resolves only the residue of the first digital estimate. The overall output signal, which is also the delta-sigma loop's feedback signal, is obtained by adding the first digital estimate to the corrective digital estimate provided by the loop quantizer. To ensure that the loop quantizer processes only the residue of the first digital estimate, the transfer function from the input signal to the loop quantizer should be very small, ideally zero. This way, the loop quantizer can be of low resolution and have a small step size relative to full scale, i.e., the output signal's physical resolution can be relatively high, say 8 to 12 bits. The loop quantizer's low resolution facilitates the use of high sampling frequencies, and the output signal's high physical resolution facilitates an even higher effective resolution using only little oversampling. Thus, this invention facilitates the implementation of high-resolution wide-bandwidth A/D converters.

Delta-sigma modulators are only as good as the digital-to-analog converter (DAC) used as the main feedback element. Only multibit DACs can provide high-resolution wide-bandwidth data conversion. Multibit DACs are, however, subject to errors caused by mismatch of electrical parameters, i.e., DAC nonlinearity. Mismatch-shaping algorithms can be used to overcome this problem, but the use of such algorithms in high-speed delta-sigma modulators may reduce the sampling frequency, and thereby reduce the system's bandwidth. A second aspect of this invention is to design the delta-sigma modulator using a multi-path mixed-delay feedback technique, for which several samples of latency can be allowed in the feedback paths that must provide spectrally-pure analog feedback signals. The topology can be optimized such that the more sensitive the system is to errors in a signal path, the more time there will be available to perform the mismatch-shaping algorithms and other techniques needed to suppress such errors.

The multi-path mixed-delay feedback technique is most easily implemented for discrete-time modulators, but it was demonstrated that it can be used successfully also for continuous-time modulators. When used for continuous-time modulators, it is preferable to avoid that the system's order exceed the loop filter's order. This can be achieved in several ways; a technique based on implementing multiple feedforward paths in the loop filter was described in detail. This technique is particularly simple to implement, and it is also relatively robust with respect to unavoidable coefficient mismatch.

The invention has been described and exemplified for both discrete-time and continuous-time delta-sigma modulators. Discrete-time modulators lend themselves to simple explanations, thus facilitating a quicker learning and understanding of the invention. Furthermore, discrete-time modulators' frequency response is generally better controlled than that of continuous-time modulators, which makes them simpler to implement. However, continuous-time modulators can generally operate at a somewhat higher sampling frequency, especially now because this invention overcomes the main obstacles caused by digital circuits' finite speed. Hence, continuous-time modulators are preferable if bandwidth is of the essence. It was demonstrated that continuous-time modulators can be implemented to operate with a physical resolution of about 9 bits without using massive-parallel circuitry.

It is to be understood that while the above description contains many specificities, these should not be construed as limitations of the scope of the invention, but rather as an exemplification of several preferred embodiments thereof. Many other variations are possible. The loop filter can be of any order. The quantizers can have any resolution, be uniform or nonuniform, and be of almost any type; even the loop quantizer can be (say) a delta-sigma modulator. The effective gain from the input signal to the loop quantizer can be made small in several ways, depending on how the loop filter is implemented. The effective gain can, for example, be reduced using analog delay lines, i.e., transmission lines for continuous-time systems, sample-and-hold circuits (also for continuous-time systems), or any other type of linear system suitable for the implementation of the loop filter's input signal paths. Similarly, the loop filter may comprise local feedback paths to increase the filter's minimum signal-band gain.

The low z-domain order of a continuous-time modulator can be preserved in several ways when using the multi-path mixed-delay feedback technique. The described technique of incorporating multiple feedforward paths in the continuous-time loop filter is only one example. Other techniques include modifying the waveforms/durations of the feedback signals' impulse responses, choosing the delays as noninteger multiples of the sampling period, etc. Digital-domain techniques may also be employed. Clearly, the delay made available may be used for any purpose, not just mismatch shaping, and several feedback paths may have the same delay.

Although the invention's advantages for the implementation of high-resolution wide-bandwidth modulators have been emphasized, it is to be understood that the techniques may be used to optimize/simplify delta-sigma modulators with any combination of speed and resolution. The general incentive to use the techniques would be to reduce the circuit complexity and to reduce the power consumption, including that of the decimation filter. The techniques may be used separately; i.e., for a low-physical-resolution modulator with multi-path mixed-delay feedback signals, or for a high-physical-resolution modulator with uniform-delay feedback signals. Also, the invention can be used for the implementation of band-pass modulators as well as baseband modulators. Clearly, the modulators can be implemented either as single-ended or differential circuits in essentially any integrated-circuits technology (bipolar, GaAs, CMOS, etc.) and also using discrete components and printed circuit boards.

Those skilled in the art will understand that many other variations and alterations are possible without departing from the spirit and scope of this invention. Accordingly, the scope of invention should be determined not by the embodiments, but by the appended claims and their legal equivalents.

I claim:

1. An oversampled analog-to-digital converter receiving an analog input signal and providing a digital output signal comprising:
   (a) a first quantizer receiving said analog input signal and providing a first digital signal;
   (b) a loop quantizer receiving an analog compensation signal and providing a digital compensation signal;
   (c) a digital circuit combining said first digital signal and said digital compensation signal to produce said digital output signal;
   (d) a residue circuit providing an analog residue signal as the difference of a function of said analog input signal and a main analog feedback signal representing said digital output signal;
   (e) an amplifying circuit receiving at least said analog residue signal and providing said analog compensation signal.

2. The analog-to-digital converter of claim 1 wherein the quantization error caused by said first quantizer is essentially uncorrelated with said analog input signal.

3. The analog-to-digital converter of claim 1 wherein said first quantizer is a delta-sigma quantizer.

4. The analog-to-digital converter of claim 1 wherein said first quantizer is a pipeline quantizer.

5. The analog-to-digital converter of claim 1 wherein said amplifying circuit further receives a signal component representing primarily said first digital signal.

6. The analog-to-digital converter of claim 1 wherein said digital compensation signal's full-scale range when referred to the digital output signal is substantially smaller than the first digital signal's full-scale range when also referred to the digital output signal.

7. The analog-to-digital converter of claim 1 wherein the values said digital compensation signal can attain are nonuniformly spaced.

8. The analog-to-digital converter of claim 1 wherein the values said first digital signal can attain are nonuniformly spaced.

9. The analog-to-digital converter of claim 1 wherein the signal-band gain from said analog input signal to said first digital signal is at least twice the gain from said analog input signal to said digital compensation signal; the gain factors are referred to the digital output signal.

10. The analog-to-digital converter of claim 1 wherein the signal-band gain from said analog input signal to said first digital signal is at least sixteen times higher than the gain from said analog input signal to said digital compensation signal; the gain factors are referred to the digital output signal.

11. The analog-to-digital converter of claim 1 wherein said amplifying circuit comprises switched-capacitor circuits.

12. The analog-to-digital converter of claim 1 wherein said amplifying circuit performs continuous-time signal processing.

13. The analog-to-digital converter of claim 1 wherein said residue circuit delays said analog input signal.

14. The analog-to-digital converter of claim 1 wherein said main analog feedback signal is generated by separately digital-to-analog converting said first digital signal and said digital compensation signal.

15. The analog-to-digital converter of claim 1 wherein said main analog feedback signal is generated using a mismatch-shaping digital-to-analog converter.

16. The analog-to-digital converter of claim 1 wherein said main analog feedback signal is generated using a digital-to-analog converter comprising circuitry suppressing dynamic errors.

17. The analog-to-digital converter of claim 1 wherein said main analog feedback signal is delayed at least one clock cycle with respect to when said loop quantizer samples said analog compensation signal.

18. The analog-to-digital converter of claim 1 wherein said main analog feedback signal is delayed at least two clock cycles with respect to when said loop quantizer samples said analog compensation signal.

19. The analog-to-digital converter of claim 1 wherein said amplifying circuit further receives at least one secondary analog feedback signal comprising a signal component comprising said analog compensation signal; said main analog feedback signal being delayed at least one clock cycle relative to said secondary analog feedback signal.

20. The analog-to-digital converter of claim 1 wherein said amplifying circuit further receives at least one secondary analog feedback signal; said secondary analog feedback signal being generated by analog signal processing of said analog compensation signal.

21. An oversampled analog-to-digital converter receiving an analog input signal and providing a multibit digital output signal comprising:
   (a) a main digital-to-analog converter providing a main analog feedback signal representing said digital output signal;
   (b) a residue circuit receiving said analog input signal and said main analog feedback signal and providing an analog residue signal;
   (c) amplifying means receiving said analog residue signal and a secondary analog feedback signal and providing an analog compensation signal;
   (d) a quantizer circuit receiving at least said analog compensation signal and providing at least said digital output signal; an origin in time being defined as when said quantizer circuit effectively samples said analog compensation signal; a first feedback signal component being obtained by sampling said analog compensation signal at and periodically with respect to said origin in time;
   (e) a feedback circuit generating said secondary analog feedback signal comprising said first feedback signal component delayed by a first number of clock cycles; said main analog feedback signal comprising said first feedback signal component delayed by a second number of clock cycles; said second number of clock cycles being at least one higher than said first number of clock cycles.

22. The oversampled analog-to-digital converter of claim 21 wherein said main digital-to-analog converter is mismatch-shaping.

23. The oversampled analog-to-digital converter of claim 21 wherein said amplifying means comprises:
   (a) a series connection comprising at least two integrating circuit stages having an input node, an output node, and at least one intermediate node;
   (b) input signal paths applying signals which are functions of said analog input signal to said intermediate node and to said output node; said input signal paths being designed such that the signal-band gain from said analog input signal to said analog compensation signal is reduced.

24. The oversampled analog-to-digital converter of claim 21 wherein said amplifying means processes said analog residue signal as a continuous-time signal.

25. The oversampled analog-to-digital converter of claim 24 wherein said main digital-to-analog converter comprises means to suppress dynamic errors in said main analog feedback signal.

26. The oversampled analog-to-digital converter of claim 24 wherein said secondary feedback signal is obtained by analog signal processing of said analog compensation signal.

27. The oversampled analog-to-digital converter of claim 24 wherein said main analog feedback signal comprises said first feedback signal component delayed by at least two clock cycles.

28. The oversampled analog-to-digital converter of claim 21 wherein said quantizer circuit comprises:
   (a) a first quantizer receiving said analog input signal and providing a first digital signal;
   (b) a loop quantizer receiving said analog compensation signal and providing a digital compensation signal;
   (c) a digital circuit combining said first digital signal and said digital compensation signal to produce said digital output signal.

29. The oversampled analog-to-digital converter of claim 28 wherein said secondary analog feedback signal is produced by separately digital-to-analog converting said digital compensation signal.

30. The oversampled analog-to-digital converter of claim 28 wherein said secondary analog feedback signal is produced by digital-to-analog converting said digital output signal.

31. The oversampled analog-to-digital converter of claim 28 wherein said first quantizer is a delta-sigma modulator.

32. The oversampled analog-to-digital converter of claim 28 wherein said main digital-to-analog converter comprises:
   (a) a primary digital-to-analog converter receiving said first digital signal and providing a main-primary analog feedback signal;
   (b) a secondary digital-to-analog converter receiving said digital compensation signal and providing a main-secondary analog feedback signal;
   (c) means to combine said main-primary analog feedback signal and said main-secondary analog feedback signal to produce said main analog feedback signal.

33. The oversampled analog-to-digital converter of claim 28 wherein the values which said first digital signal can attain are nonuniformly spaced.

34. The oversampled analog-to-digital converter of claim 28 wherein the values that said digital compensation signal can attain are nonuniformly spaced.

35. The oversampled analog-to-digital converter of claim 28 for which a full-scale variation of said digital compensation signal will cause a variation in said digital output signal which is significantly smaller than the variation in said digital output signal that would result from a full-scale variation of said first digital signal.

36. A method for converting an analog input signal into a digital output signal comprising the steps of:
   (a) generating a first digital signal representing said analog input signal;
   (b) generating a second digital signal representing an analog compensation signal;
   (c) combining said first digital signal and said second digital signal to produce said digital output signal;
   (d) generating a main analog feedback signal representing a combination of said first digital signal and said second digital signal;

(e) generating a main analog residue signal by subtracting said main analog feedback signal from a function of said analog input signal;

(f) generating said analog compensation signal partially by amplifying said main analog residue signal.

37. The method of claim 36 wherein the step of generating said first digital signal comprises the steps of:

(a) generating a first local analog feedback signal by digital-to-analog converting said first digital signal;

(b) subtracting said first local analog feedback signal from said analog input signal to produce a local analog residue signal;

(c) amplifying said local analog residue signal.

38. The method of claim 36 wherein the step of generating said analog compensation signal comprises the steps of:

(a) generating a first local analog signal representing said first digital signal;

(b) generating a local analog residue signal by subtracting said first local analog signal from said analog input signal;

(c) generating a second local analog signal by amplifying said main analog residue signal;

(d) generating said analog compensation signal by adding said second local analog signal and said local analog residue signal.

39. The method of claim 36 wherein the step of generating said analog compensation signal comprises the steps of:

(a) producing a second local analog signal by amplifying said main analog residue signal;

(b) producing a third local analog signal by amplifying said analog input signal;

(c) producing said analog compensation signal by adding said second local analog signal and said third local analog signal, thereby reducing the magnitude of said analog compensation signal.

40. The method of claim 36 further comprising the step of: sampling the analog input signal.

41. The method of claim 36 further comprising the step of: providing a quantizer with nonuniform step size.

42. The method of claim 36 wherein the step of generating said main analog feedback signal comprises the step of: providing a mismatch-shaping digital-to-analog converter.

43. The method of claim 36 wherein the step of generating said main analog feedback signal comprises the step of: providing a digital-to-analog converter comprising circuitry to suppress dynamic errors.

44. The method of claim 36 wherein the step of generating said main analog feedback signal comprises the step of: delaying said main analog feedback signal by at least two clock cycles with respect to said analog compensation signal.

45. A method for converting a continuous-time analog input signal into a digital output signal comprising the steps of:

(a) generating said digital output signal comprising a signal component obtained by quantizing an analog compensation signal;

(b) providing a first feedback loop to and from said analog compensation signal comprising said first amplifying circuit and a second amplifying circuit providing substantially more than 0 dB gain at a second signal-band frequency; said second feedback loop's discrete-time representation comprising a minimum delay of at least two clock cycles;

(c) providing at least one first input signal path from said analog input signal to said analog compensation signal.

46. The method of claim 45 further comprising the step of:

(a) providing a second feedback loop with essentially frequency-independent gain.

47. The method of claim 45 further comprising the step of:

(a) providing a mismatch-shaping digital-to-analog converter.

48. The method of claim 45 further comprising the step of:

(a) providing a digital-to-analog converter comprising a deglitching output stage.

49. The method of claim 45 wherein said first input signal path comprises an analog delay line.

50. The method of claim 45 further comprising the steps of:

(a) generating a first digital signal representing said analog input signal;

(b) generating a digital compensation signal representing said analog compensation signal;

(c) generating said digital output signal by adding said first digital signal and said digital compensation signal.

51. The method of claim 50 further comprising the step of:

(a) providing multiple input signal paths from said analog input signal to said analog compensation signal; said multiple input signal paths being designed such that the gain from said analog input signal to the digital compensation signal is substantially lower than the gain from said analog input signal to said first digital signal.

52. The method of claim 50 further comprising the step of:

(a) providing a flash quantizer with nonuniform step size.

53. The method of claim 45 further comprising the step of:

(a) providing a feedback loop comprising only analog signal processing.

* * * * *